(12) United States Patent
Majhi et al.

(10) Patent No.: US 10,355,205 B2
(45) Date of Patent: Jul. 16, 2019

(54) RESISTIVE MEMORY CELLS INCLUDING LOCALIZED FILAMENTARY CHANNELS, DEVICES INCLUDING THE SAME, AND METHODS OF MAKING THE SAME

(71) Applicants: Prashant Majhi, San Jose, CA (US); Ravi Pillarisetty, Portland, OR (US); Niloy Mukherjee, Portland, OR (US); Uday Shah, Portland, OR (US); Elijah V. Karpov, Portland, OR (US); Brian S. Doyle, Portland, OR (US); Robert S. Chau, Beaverton, OR (US)

(72) Inventors: Prashant Majhi, San Jose, CA (US); Ravi Pillarisetty, Portland, OR (US); Niloy Mukherjee, Portland, OR (US); Uday Shah, Portland, OR (US); Elijah V. Karpov, Portland, OR (US); Brian S. Doyle, Portland, OR (US); Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 41 days.

(21) Appl. No.: 15/528,674

(22) PCT Filed: Dec. 18, 2014

(86) PCT No.: PCT/US2014/071173
§ 371 (c)(1),
(2) Date: May 22, 2017

(87) PCT Pub. No.: WO2016/099511
PCT Pub. Date: Jun. 23, 2016

(65) Prior Publication Data
US 2017/0271583 A1    Sep. 21, 2017

(51) Int. Cl.
*H01L 29/08* (2006.01)
*H01L 45/00* (2006.01)

(52) U.S. Cl.
CPC ............ *H01L 45/122* (2013.01); *H01L 45/08* (2013.01); *H01L 45/12* (2013.01);
(Continued)

(58) Field of Classification Search
USPC ......................................... 257/40
See application file for complete search history.

(56) References Cited

U.S. PATENT DOCUMENTS 5,399,917 A    3/1995 Allen et al.
5,434,531 A    7/1995 Allen et al.
(Continued)

FOREIGN PATENT DOCUMENTS

CN    101621114 A    1/2010
CN    103955440 A    3/2014
(Continued)

OTHER PUBLICATIONS

Extended European Search Report received in Patent Application No. US2014071173, dated Jul. 12, 2018, 7 pages.
(Continued)

*Primary Examiner* — Caleb E Henry
(74) *Attorney, Agent, or Firm* — Grossman, Tucker, Perreault & Pfleger, PLLC

(57) ABSTRACT

Resistive memory cells are described. In some embodiments, the resistive memory cells include a switching layer having an inner region in which one or more filaments is formed. In some instances, the filaments is/are formed only within the inner region of the switching layer. Methods of making such resistive memory cells and devices including such cells are also described.

24 Claims, 12 Drawing Sheets

(52) U.S. Cl.
CPC ........ *H01L 45/1233* (2013.01); *H01L 45/146* (2013.01); *H01L 45/1608* (2013.01); *H01L 45/1641* (2013.01)

(56) References Cited

U.S. PATENT DOCUMENTS

| | | | |
|---|---|---|---|
| 6,847,208 | B1 | 1/2005 | Crowley et al. |
| 8,819,335 | B1 | 8/2014 | Salessi et al. |
| 8,883,557 | B1 | 11/2014 | Hsueh et al. |
| 9,231,204 | B2 | 1/2016 | Karpov et al. |
| 9,484,087 | B2 | 11/2016 | Lee et al. |
| 9,647,208 | B2 | 5/2017 | Karpov et al. |
| 9,653,680 | B2 | 5/2017 | Pillarisetty et al. |
| 2004/0245557 | A1 | 12/2004 | Seo et al. |
| 2010/0019219 | A1* | 1/2010 | Lee .................. H01L 45/08 257/4 |
| 2010/0110758 | A1 | 5/2010 | Li et al. |
| 2010/0178729 | A1 | 7/2010 | Yoon et al. |
| 2010/0025878 | A1 | 10/2010 | Kuse et al. |
| 2010/0314602 | A1* | 12/2010 | Takano ............. G11C 11/5685 257/4 |
| 2011/0073828 | A1 | 3/2011 | Xia et al. |
| 2011/0155989 | A1 | 6/2011 | Park et al. |
| 2012/0054236 | A1 | 3/2012 | Branscome et al. |
| 2012/0112153 | A1 | 5/2012 | Ninomiya et al. |
| 2012/0261637 | A1 | 10/2012 | Jun et al. |
| 2012/0280201 | A1 | 11/2012 | Sekar et al. |
| 2012/0313069 | A1 | 12/2012 | Wang et al. |
| 2013/0009122 | A1 | 1/2013 | Park et al. |
| 2013/0010529 | A1 | 1/2013 | Hayakawa et al. |
| 2013/0021835 | A1 | 1/2013 | Hwang et al. |
| 2013/0069031 | A1 | 3/2013 | Huang et al. |
| 2013/0193397 | A1 | 8/2013 | Lin et al. |
| 2013/0248804 | A1 | 9/2013 | Kawai |
| 2014/0008602 | A1 | 1/2014 | Karpov et al. |
| 2014/0061568 | A1 | 3/2014 | Ramaswamy et al. |
| 2014/0092666 | A1 | 4/2014 | Karpov et al. |
| 2014/0175363 | A1 | 6/2014 | Tendulkar et al. |
| 2014/0175371 | A1 | 6/2014 | Karpov et al. |
| 2014/0197368 | A1* | 7/2014 | Yoneda ................. H01L 45/08 257/2 |
| 2014/0246643 | A1 | 9/2014 | Kim et al. |
| 2014/0264247 | A1 | 9/2014 | Daryanani et al. |
| 2014/0322885 | A1 | 10/2014 | Xie et al. |
| 2016/0359108 | A1 | 12/2016 | Majhi et al. |

FOREIGN PATENT DOCUMENTS

| | | |
|---|---|---|
| CN | 106030801 A | 10/2016 |
| CN | 106663683 A | 5/2017 |
| JP | 2005-123574 A | 5/2005 |
| JP | 2010-153868 A | 7/2010 |
| KR | 10-2006-0083368 A | 7/2006 |
| KR | 10-2008-0000357 A | 1/2008 |
| KR | 10-2009-0108221 A | 10/2009 |
| KR | 10-2012-0006502 A | 1/2012 |
| KR | 10-2016-0137522 A | 11/2016 |
| KR | 10-2017-0059971 A | 5/2017 |
| KR | 10-2017-0059974 A | 5/2017 |
| TW | 201624676 A | 7/2016 |
| TW | 201633512 A | 9/2016 |
| TW | 201640620 A | 11/2016 |
| TW | I556443 B | 11/2016 |
| WO | 2014-051725 A1 | 4/2014 |
| WO | 2015-147801 A1 | 10/2015 |
| WO | 2016-048327 A1 | 3/2016 |
| WO | 2016-048330 A1 | 3/2016 |

OTHER PUBLICATIONS

USPTO Office Action in U.S. Appl. No. 15/529,907, dated Jun. 28, 2018, 16 pages.
Extended European Search Report received in Patent Application No. PCT/US2014072330, dated Jul. 12, 2018, 6 pages.
Office Action issued in U.S. Appl. No. 15/529,907, dated Mar. 26, 2018, 10 pages.
U.S. Appl. No. 15/529,907, filed May 25, 2017.
International Preliminary Report on Patentability and Written Opinion issued in PCT Application No. PCT/US2014/072330, dated Jun. 27, 2017, 10 pages.
International Search Report and Written Opinion issued in PCT Application No. PCT/US2014/072330, dated Sep. 24, 2015, 14 pages.
International Preliminary Report on Patentability and Written Opinion issued in PCT Application No. PCT/US2014/057470, dated Mar. 28, 2017, 11 pages.
International Search Report and Written Opinion issued in PCT Application No. PCT/US2014/057470, dated Jun. 25, 2015, 13 pages.
International Preliminary Report on Patentability and Written Opinion issued in PCT Application No. PCT/US2014/031735, dated Sep. 27, 2016, 9 pages.
International Search Report and Written Opinion issued in PCT Application No. PCT/US2014/031735, dated Dec. 23, 2014, 11 pages.
International Preliminary Report on Patentability and Written Opinion issued in PCT Application No. PCT/US2014/057494, dated Mar. 28, 2017, 10 pages.
International Search Report and Written Opinion issued in PCT Application No. PCT/US2014/057494, dated Jun. 25, 2015, 12 pages.
International Preliminary Report on Patentability and Written Opinion issued in PCT Application No. PCT/US2014/071173, dated Jun. 20, 2017, 11 pages.
International Search Report and Written Opinion issued in PCT Application No. PCT/US2014/071173, dated Aug. 31, 2015, 15 pages.
International Preliminary Report on Patentability and Written Opinion issued in PCT Application No. PCT/US2014/071173, dated Jun. 29, 2017, 12 pages.
International Preliminary Report on Patentability and Written Opinion issued in PCT Application No. PCT/US2013/045034, dated Mar. 31, 2015, 7 pages.
International Search Report issued in PCT Application No. PCT/US2013/045034, dated Nov. 18, 2013, 4 pages.
Notice of Allowance issued in U.S. Appl. No. 13/630,795, dated Sep. 8, 2015, 7 pages.
Office Action issued in U.S. Appl. No. 13/630,795, dated Apr. 14, 2015, 6 pages.
European Office Action in European Patent Application No. 14909250.4, dated Mar. 26, 2019, 4 pages.
Taiwan Office Action in Taiwan Patent Application No. 104138555 dated Feb. 14, 2019, 22 pages.
Chinese Office Action received in Chinese Patent Application No. 201480083609, dated Apr. 16, 2019, 18 pages.
European Search Report from related application EP14908597.9 dated May 31, 2019.

* cited by examiner

RESISTIVE MEMORY CELLS INCLUDING LOCALIZED FILAMENTARY CHANNELS, DEVICES INCLUDING THE SAME, AND METHODS OF MAKING THE SAME

FIELD

The present disclosure relates to resistive memory cells including localized filamentary channels. Devices including said resistive memory cells and methods of making such resistive memory cells are also described.

BACKGROUND

Resistive memory, such as resistive random access memory (ReRAM or RRAM) generally includes a plurality of resistive memory cells. Such cells may be in the form of a two terminal device in which a comparatively insulating switching layer or medium is positioned between two conductive electrodes. In some instances, devices include one transistor (1T) or one diode (1D) along with one resistor (1R), resulting in 1T1R or 1D1R configurations. The resistive memory cells of RRAM can change between two different states, a high resistance state (HRS) which may be representative of an OFF or 0 state; and a low resistance state (LRS) which may be representative of an ON or a 1 state. In many instances a reset process is used to switch one or more cells of the RRAM device to the HRS using a reset voltage, and a set process is used to switch one or more cells of RRAM device to the LRS using a set voltage.

Some resistive memory devices operate based on the formation and breakage of filamentary channels (hereinafter, filaments) within the switching layer of individual resistive memory cells. Such devices, referred to herein as filamentary resistive memory, require the execution of an initial forming process, during which a relatively high voltage stress (known as a forming voltage) is applied to initially cause vacancies within the switching layer of a resistive memory cell to form one or more filaments. Such filaments may provide low resistance pathways between the conductive electrodes of the cell, and thus may place the cell in a low resistance state. After the forming process, the filaments may be broken and reformed via the application of reset and set voltages, respectively, so as to toggle the cell between a high resistance and a low resistance state.

While existing filamentary resistive memory has shown some promise, the execution of the forming process can result in the production of an unpredictable number and distribution of filaments within the switching layer of a resistive memory cell. For example, execution of the forming process may produce a first (e.g. 5) number filaments that are homogenously distributed within the switching layer of one resistive memory cell, but may produce a second (e.g., 8) filaments that are randomly or inhomogeneously distributed in another resistive memory cell. Moreover the size of the filaments created by the forming process may vary significantly within and/or among the plurality of resistive memory cells of a filamentary resistive memory device. As a result, the electrical characteristics (e.g., set and/or reset voltages) of the resistive memory cells of such devices may vary considerably from one another.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

The terms "over," "under," "between," and "on," are often used herein to refer to a relative position of one material layer or component with respect to other material layers or components. For example, one layer disposed on (e.g., over or above) or under (below) another layer may be directly in contact with the other layer, or may have one or more intervening layers. Moreover one layer disposed between two other layers may be directly in contact with the two other layers or may be separated by one or more of the other layers, e.g., by one or more intervening layers. Similarly unless expressly indicated to the contrary, one feature that is adjacent to another feature may be in direct contact with the adjacent feature, or may be separated from the adjacent feature by one or more intervening features. In contrast, the terms "directly on" or "directly below" are used to denote that one material layer is in direct contact with an upper surface or a lower surface, respectively, of another material layer. Likewise, the term "directly adjacent" means that two features are in direct contact with one another.

As briefly explained in the background, interest has grown in the use of resistive memory such as resistive random access memory (RRAM) for short or long term storage of information. In general, resistive memory includes a plurality of resistive memory cells that may transition between a high resistance state (HRS) or ON state and a low resistance state (LRS) or OFF state, e.g., in response to the application of a voltage. Information may therefore be stored in such devices in the form of logical 1's and 0's, e.g., by appropriately controlling the state of the resistive memory cells in the device.

Figure 1:
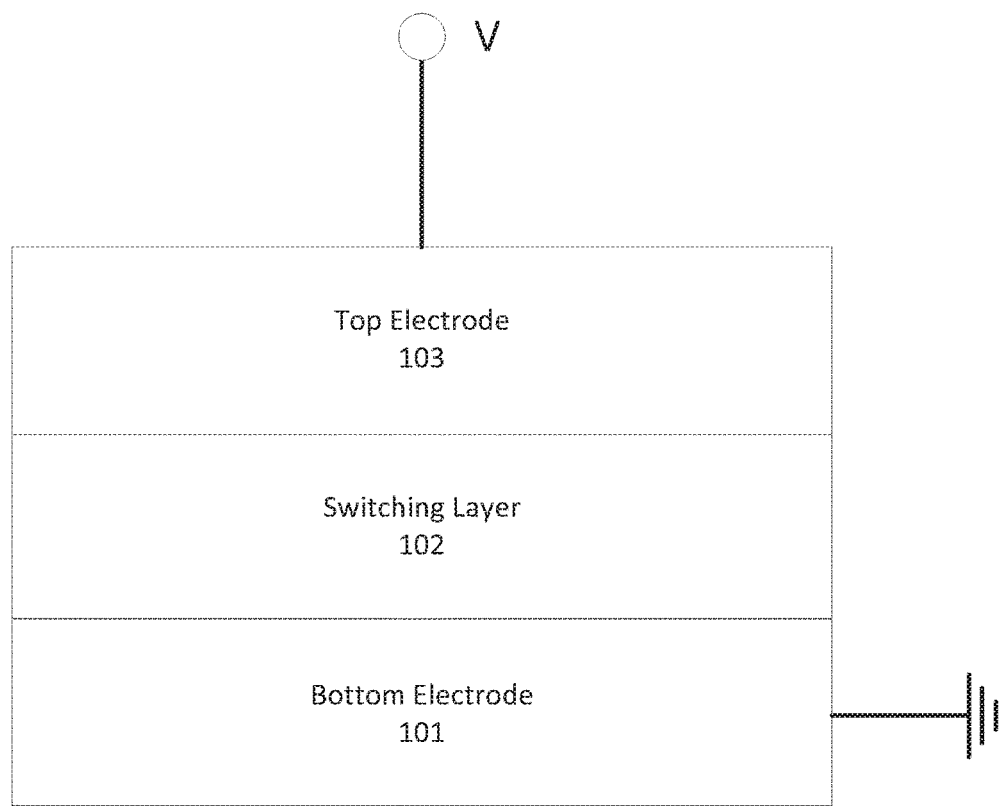
FIG. 1 is a high level diagram of the structure of one example of a resistive memory cell structure.

With the foregoing in mind reference is made to FIG. 1, which is a high level diagram of the structure of one example of a resistive memory cell 100. While the instant discussion focuses on the features of resistive memory cell 100 per se, it should be understood that a plurality of resistive memory cells 100 may be coupled and/or otherwise configured to form a resistive memory device, such as an RRAM or other suitable memory.

As shown in FIG. 1, resistive memory cell 100 (e.g., an RRAM cell) includes bottom (first) electrode 101, switching layer 102, and top (second) electrode 103.

Switching layer 102 is formed on bottom electrode 101, and top electrode 103 is formed on switching layer 102. Bottom electrode 101 may connected to electrical ground, and top electrode 103 may be connected to a voltage source, V. The voltage source may be supplied, for example, by a transistor in a 1T1R or a diode in a 1D1R configuration. Without limitation, in some embodiments switching layer 102 is formed directly on bottom electrode 101 and top electrode 103 is formed directly on switching layer 102.

In instances where resistive memory cell 100 is a filamentary resistive memory cell, switching layer 102 may formed from an oxide that contains a plurality of oxygen vacancies. For example and as will be described later, switching layer 102 may be fully or partially formed from a sub-stoichiometric oxide, which may be understood as an oxide that does not contain a stoichiometric amount of oxygen. Depending on the manner in which switching layer 102 is formed, oxygen or other vacancies may be included in switching layer 102 as it is deposited, or they may be introduced subsequent to the formation (e.g., deposition) of switching layer 102 (or, more particularly, a precursor thereof).

In any case a forming process may be applied to cause vacancies within switching layer 102 to form filamentary channels, e.g., which lower the electrical resistance of cell 100. Subsequent to the forming process, reset and set voltages may be applied to break and reform the filamentary channels, toggling the resistive memory cell between OFF (HRS) and ON (LRS) states. As noted in the background, however, the number, size, and location (distribution) of filamentary channels that are created within switching layer 102 during the forming process may vary considerably between resistive memory cells. As a result, electrical characteristics of resistive memory cells in a resistive memory device may vary considerably, which may be undesirable.

Figure 2A:
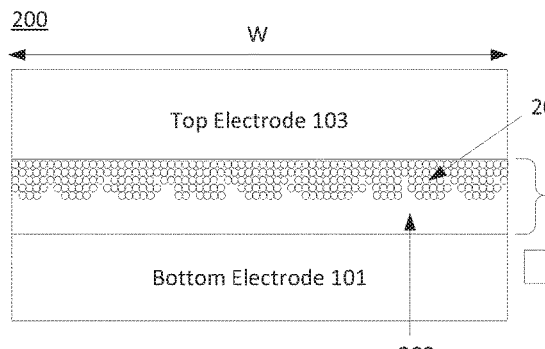
FIGS. 2A-2D stepwise illustrate one example process for forming a resistive memory cell.

To further explain the above mentioned problem reference is made to FIGS. 2A-D, which stepwise illustrate one example of the formation of a resistive memory cell, in which control is not exercised over the distribution vacancies within the switching layer prior to the execution of a forming process. As shown in FIG. 2A, the formation of a resistive memory cell may begin with the provision of a cell precursor 200. As shown, precursor 200 includes bottom electrode 101, switching layer precursor 102', and top electrode 103, which are generally arranged in the manner shown in FIG. 1 and described above.

In the example of FIG. 2A, precursor 200 has a total width W, which is the same or substantially the same as the width of switching layer precursor 102'. Switching layer precursor 102' further includes a plurality of vacancies 201 (e.g., oxygen vacancies), which are distributed within material 202 of switching layer precursor 102'. In this regard and as will be further explained below, all or a portion of switching layer precursor 102' may include or be formed from a sub-stoichiometric oxide, which may be understood as an oxide that does not include a stoichiometric amount of oxygen.

As further shown in FIG. 2, vacancies 201 are distributed across the entire width of switching layer precursor 102', and thus across the total width, W, of precursor 200. Furthermore, the concentration of vacancies 201 near the interface of switching layer precursor 102' and top electrode 103 is relatively high, as compared to the concentration of vacancies near the interface of bottom electrode 101 and switching layer precursor 102'. As may be understood, such a distribution may be obtained, for example, by initially forming switching layer precursor 102' from a stoichiometric oxide, forming top electrode 103 from an electrode material that is conductive but also reactive with oxygen, and heat treating the resulting structure. During the heat treatment, the electrode material of top electrode 103 (or an intervening oxygen exchange layer between top electrode 103 and switching layer precursor 102') may react with at least a portion of the oxygen in switching layer precursor 102', e.g. resulting in the formation of oxygen vacancies 201 proximate the interface between top electrode 103 and switching layer 102, as generally shown in FIG. 2A.

Figure 2B:
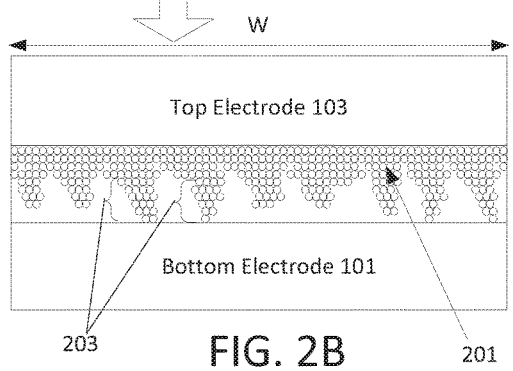

To form a filamentary resistive memory cell, a forming process may be executed on precursor 200 (or, more specifically, on switching layer precursor 102'). In general, execution of the forming process may cause filamentary channels (filaments) to form within switching layer precursor 102', resulting in the formation of a switching layer 102, as generally illustrated in FIG. 2B. As used herein, the term "forming process" refers to a process during which a (relatively high) voltage is applied to a resistive cell precursor (or, more particularly, a switching layer precursor thereof), so as to cause vacancies within the switching layer precursor to form one or more filamentary channels. The parameters and manner of executing a forming process in the context of resistive memory is well understood in the art, and therefore is not discussed in detail herein. In any case, an outcome of a forming process may be understood to be the formation of a switching layer containing one or more filaments. As may be understood, formation of such filaments may provide low electrical resistance pathways between a bottom and top electrode of a resistive memory cell, thus lowering the resistance of the cell and placing the cell in a low resistance (e.g., ON) state. This concept is illustrated in FIG. 2B, which illustrates the production of filaments 203 in switching layer 102 in response to the execution of a forming process on precursor 200.

Figure 2C:
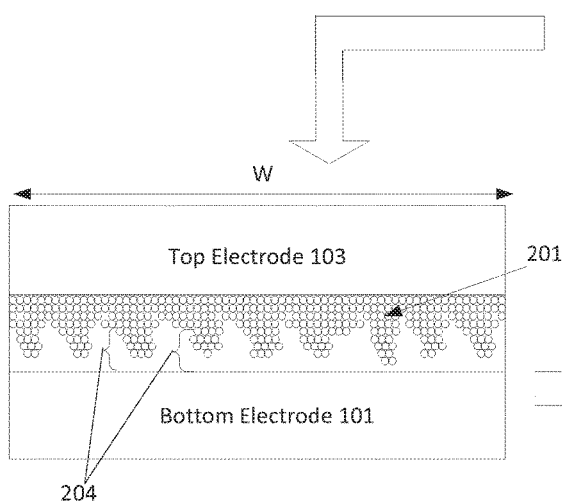
Figure 2D:
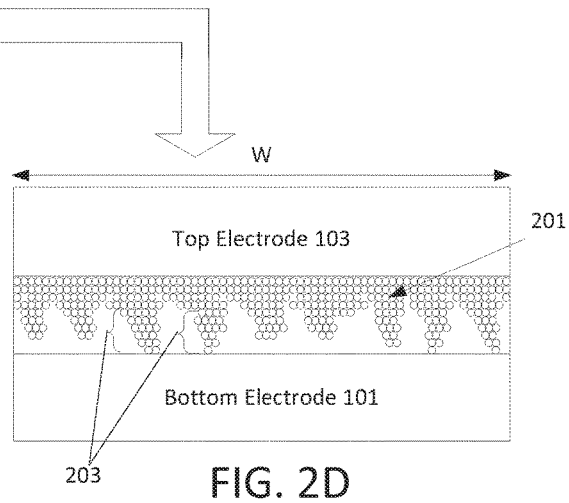

Subsequent to the execution of the forming process, the resistive memory cell may be toggled between an OFF state (HRS) and an ON state (LRS) by the application of reset and set voltages, respectively. As shown in FIG. 2C, application of a reset voltage to switching layer 102 may break filaments 203, thereby increasing the resistance of switching layer 102 and placing the resistive memory cell in an OFF (HRS) state. Subsequently and as shown in FIG. 2D, application of a set voltage (e.g., of equal value but opposite polarity to the reset voltage) to switching layer 102 may result in the reformation of filaments 203, thereby reducing the resistance of switching layer 102 and placing the resistive memory cell in an ON (LRS) state.

With the foregoing in mind, reference is again made to FIG. 2B, which illustrates the outcome of a forming process on precursor 200. As shown, execution of the forming process in this example resulted in the creation of a switching layer 102 containing 4 filaments 203. It should be understood however that this illustration is for the sake of example only and that the number, size and distribution of filaments 203 formed by the execution of a forming process on precursor 200 vary considerably from cell to cell. That is, execution of the same or similar forming process on first and second precursors 200 may result in the formation of a different number, size and/or distribution of filaments within their respective switching layers. For example, instead of forming 4 filaments as shown in FIG. 2B, execution of the forming process on another (e.g., second) precursor 200 may result in the production of 8 filaments. Moreover the size and/or distribution of the filaments formed by executing a forming process on a first precursor may differ from the size and/or distribution of the filaments formed by executing the same or similar forming process on a second precursor, even though the first and second precursor may have the same or substantially the same structure.

This variability can cause issues when cells such as those described in connection with FIGS. 2A-2D are used in to form a resistive memory device such as an RRAM. Indeed such variability may cause electrical properties such as the set and reset voltages of the plurality of cells in such a device to vary considerably from one another, potentially hindering device performance. Without wishing to be bound by theory, it is believed that at least some of the variability in filament formation may be attributable to the distribution of oxygen vacancies in the switching layer precursor of a resistive memory cell precursor, such as precursor 200. That is, because the concentration and distribution of oxygen vacancies within switching layer precursor 102' can vary considerably from precursor 200 to precursor 200, it is believed that such variability can lead to the production of an unpredictable number, size and distribution of filaments when a forming process is executed.

With the foregoing in mind, the present disclosure generally relates to resistive memory cells, devices, and methods of forming the same, wherein the distribution of vacancies within the switching layer of a cell precursor is controlled prior to the execution of a forming process. As will become apparent from the following discussion, controlling the distribution of vacancies in the cell precursor may enable a forming process to result in the production of one or more filaments that are localized within a specified region of switching layer. Moreover in some embodiments, control of the distribution of vacancies in the precursor may also enable forming processes that favors the formation of a predictable number of filaments within the specified region and, in some cases, the formation of filaments having similar physical characteristics, e.g., width, profile, etc. As a result, the technologies described here may enable the production of a plurality of resistive memory cells that exhibit relatively consistent electrical characteristics (e.g., set voltage, reset voltage, etc.), e.g., due to the presence of the same or similar number, size, and/or distribution of filaments within their respective switching layers.

With the foregoing in mind, one aspect of the present disclosure relates to resistive memory cells in which filamentary channels are localized within a particular region of a switching layer. In this regard, reference is made to FIG. 3 which illustrates the structure of one example of a resistive memory cell consistent with the present disclosure, in this case after execution of a forming process on an appropriate precursor. As shown, resistive memory cell 300 includes bottom (first) electrode 101, a switching layer 302 formed on bottom electrode 101, and a top (second) electrode 103 formed on switching layer 302. For the sake of clarity, electrical connections (e.g. ground, voltage source, etc.) that may be made to cell 300 are not illustrated in FIG. 3.

Figure 3:
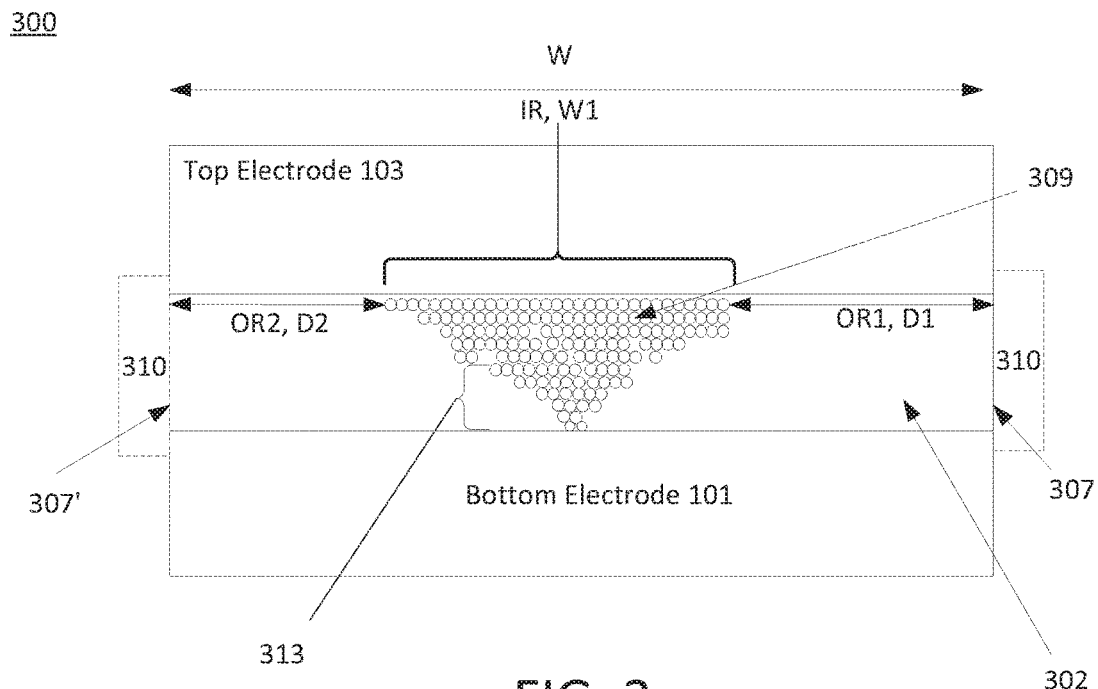
FIG. 3 depicts the structure of one example of a resistive memory cell consistent with the present disclosure.

As further shown in FIG. 3, cell 300 has a total width, W, which may be any suitable width. In some embodiments the total width, W, may range from about 1 to about 300 nanometers (nm). In some embodiments, the total width, W, of cell 300 ranges from about 1 to about 100 nanometers (nm), or even from about 1 to about 50 nm.

Bottom electrode 101 and top electrode 103 may be any suitable electrode material. As non-limiting examples of suitable materials that may be to form bottom electrode 101 and/or top electrode 103, mention is made of metals such as aluminum, copper, titanium, tungsten, ruthenium, rhodium, palladium, silver, osmium, iridium, platinum, and gold, metal nitrides such as titanium nitride, tantalum nitride, combinations thereof, and the like.

The thickness of bottom electrode 101 and top electrode 103 may vary widely, and any suitable thickness may be used. In some embodiments, the bottom electrode and top electrode each have a thickness ranging from about 2 to about 50 nm, such as about 2 to about 25 nm. Likewise, the thickness of switching layer 302 (and the other switching layers described herein) may vary widely. In some embodiments, switching layer 302 (or another switching layer described herein) may have a thickness ranging from about 2 to about 50 nm, such as about 2 to about 25 nm. In this example, switching layer 302 includes a first side 307 and a second side 307', an inner region (IR), a first outer region (OR1), and a second outer region (OR2). As shown, the first and second outer regions may be adjacent (e.g., directly adjacent) the inner region (IR). With this in mind, the inner region (IR) may be generally disposed between first and second sides 307, 307'. Inner region (IR) may have first and second sides (not labeled), wherein the first side of inner region (IR) is spaced from first side 307 by a distance D1, the second side of inner region (IR) is spaced from second side 307' by a distance D2, and D1 and D2 are a fraction or percentage of the total width, W, of cell 300. For example in some embodiments D1 and/or D2 may range from about 10 to about 40% of W. Thus for example, where W is 50 nanometers (nm), D1 and/or D2 may range from about 5 to about 20 nm. Of course such specific values are for the sake of example only, and D1 and D2 may be any suitable distance.

It is noted that in the example of FIG. 3, D1 and D2 are illustrated as being the same or substantially the same. It should be understood that such illustration is for the sake of clarity only, and that D1 and D2 need not be the same or substantially the same. Indeed the present disclosure envisions embodiments in which D1 and D2 are the same or different, and may be tailored as desired. For example, D1 and D2 in some embodiments may be tailored so as to laterally position inner region (IR) at a desired location within switching layer 302. This may be accomplished, for example, by adjusting the parameters of a controlled oxidation process, as will be discussed later.

As may be appreciated from the foregoing and as further shown in FIG. 3, inner region (IR) has a width (W1) that is less than the total width (W) of cell 300 and/or switching layer 302. In some embodiments, W1 ranges from greater than 0 to about 100 nm, such as from greater than 0 to about 30 nm, from greater than 0 to about 15 nm, or even from greater than 0 to about 10 nm. Without limitation, in some embodiments W1 is about 10 nm. Put in other terms, in some embodiments W1 is a fraction or a percentage of the total width (W) of cell 300 and/or switching layer 302. Thus for example, in some embodiments W1 may range from about 10 to about 40% of W, such as from about 10 to about 30% of W.

At least a portion of switching layer 302 may be formed from a sub-stoichiometric oxide. As used herein, the term "sub-stoichiometric oxide" refers to an oxide that does not contain a stoichiometric amount of oxygen. Put in other terms, the term sub-stoichiometric oxide refers to an oxide in which at least a portion of the oxygen has been removed, leaving oxygen vacancies therein. Non-limiting examples of sub-stoichiometric oxides that may be used include but are not limited to hafnium oxide ($HfO_{2-x}$), tantalum oxide ($Ta_2O_{5-x}$), nickel oxide ($NiO_{2-x}$), tungsten (III) oxide ($W_2O_{3-x}$), tungsten (IV) oxide ($WO_{2-x}$), tungsten (IV) oxide ($WO_{3-x}$), tungsten pentoxide ($W_2O_{5-x}$), titanium oxide ($TiO_{2-x}$), zirconium oxide ($ZrO_{2-x}$), vanadium oxide ($VO_{2-x}$), copper (II) oxide ($CuO_{1-x}$), aluminum oxide ($Al_2O_{3-x}$), combinations thereof, and the like, wherein x is greater than or equal to about 25% of the fully stoichiometric oxygen content of the corresponding stoichiometric oxide. Thus in $HfO_{2-x}$, x may be greater than or equal to about 0.5.

For example and as shown in FIG. 3, in some embodiments inner region (IR) of switching layer 302 may be formed from a sub-stoichiometric oxide material, such as those mentioned above. Without limitation, switching layer 302 in some embodiments is formed from hafnium oxide ($HfO_{2-x}$), tantalum oxide ($Ta_2O_{5-x}$), or a combination thereof, where x is greater than or equal to about 5% of the fully stoichiometric oxygen content of the oxide. That is, in the case of $HfO_{2-x}$, x may be greater than or equal to about 0.1, whereas in the case of $Ta_2O_{5-x}$, x may be greater than or equal to about 0.25.

In some embodiments first and second outer regions (OR1, OR2) may be formed from or include a substantially stoichiometric oxide. As used herein, the term "substantially stoichiometric oxide" refers to an oxide that contains a fully stoichiometric amount of oxygen, or in which the mole fraction of oxygen in the oxide differs from the stoichiometric amount by less than 5%. Non-limiting examples of suitable substantially stoichiometric oxides that may be used to form first and second outer regions (OR1, OR2) include but are not limited to the oxides identified above as suitable for use as sub-stoichiometric oxides, but where x is 0 or less than 5% of the stoichiometric amount of oxygen in the relevant oxide. Thus for example, in some embodiments first and second outer regions OR1, OR2 may be formed from substantially stoichiometric $HfO_{2-x}$, wherein x may range from 0 to less than 0.1 (i.e., 5% of 2). In other embodiments, first and second outer regions OR1, OR2 may be formed from substantially stoichiometric $Ta_2O_{5-x}$, wherein x may range from 0 to less than 0.25 (i.e., 5% of 5).

In any case, because at least a portion of switching layer 302 is or includes a sub-stoichiometric oxide, switching layer 302 may include a plurality of oxygen vacancies. This concept is illustrated in FIG. 3, wherein switching layer 302 is illustrated as including a plurality of oxygen vacancies 309. Without limitation, oxygen vacancies are preferably localized/concentrated within inner region (IR) of switching layer 302, as generally illustrated in FIG. 3.

As will be described in detail below, localization of oxygen vacancies within inner region (IR) may accomplished, for example, by depositing layer(s) of a sub-stoichiometric oxide on bottom electrode (101) (e.g., via chemical vapor deposition (CVD), metal organic CVD, reactive CVD, reactive sputtering, atomic layer deposition, etc.), e.g., such that a plurality of oxygen vacancies are distributed throughout the entire width of switching layer 302. The deposited layer(s) of sub-stoichiometric oxide may then be processed, e.g. via a controlled oxidation process in which the sides of the deposited layer(s) are exposed to an atmosphere containing oxygen, e.g., during an annealing process. Due to such exposure, oxygen vacancies proximate first and second sides 307, 307' (e.g., within first and second outer regions (OR1, OR2) may be occupied with oxygen, whereas oxygen vacancies located further inward from first and second sides 307, 307' (e.g., within inner region (IR)) may remain unoccupied. In this manner, oxygen vacancies may be localized within inner region (IR).

In instances where switching layer 102 is processed with a controlled oxidation process, cell 300 may optionally further include protective layers 310. In general, protective layers 310 may be formed from an oxygen impermeable material. Examples of such materials include but are not limited to binary and ternary metal nitrides such as titanium nitride, tantalum nitride, titanium aluminum nitride, tantalum aluminum nitride, metal carbides such as titanium carbide, combinations thereof, and the like. When protective layers 310 are used, they may be deposited or otherwise formed so as to cover all or a portion of an exposed side of switching layer 302, such as first and second sides 307, 307'. For example, after switching layer 302 has been subjected to a controlled oxidation process, protective layers 310 may be deposited so as to cover all or a portion of sides 307, 307'. Because protective layers 310 are oxygen impermeable, they may limit or prevent the exposure of switching layer 302 (or, more specifically, first and second sides 307, 307') to oxygen that may be present in the surrounding atmosphere.

Regardless of whether protective layers 310 are used, a forming voltage may be applied to the resulting precursor (or, more specifically, to a switching layer precursor therein), so as to produce a switching layer in which oxygen vacancies form one or more filaments within inner region (IR) thereof. This concept is illustrated in FIG. 3, which illustrates cell 300 (e.g., after a forming process) as including a single filament 313 within inner region (IR). In some embodiments, filaments 313 are formed only within inner region (IR)

It is noted that the illustration of a single filament 313 in FIG. 3 is for the sake of example only, and that any suitable number of filaments 313 may be formed within inner region (IR). Indeed, the present disclosure envisions embodiments where multiple (e.g., 2, 3, 4, 5, etc.) filaments are formed within an inner region (IR) of a switching layer in response to a forming or set voltage. Without limitation, in some embodiments the switching layer precursors described herein are configured such that only a single filament is formed in switching layer 302 in response to application of a forming or set voltage (e.g., less than or equal to about 1.5V). In some embodiments, the single filament is formed only within inner region (IR), and provides a low resistance pathway to place cell 300 in a low resistance (ON) state. In any case, the filament(s) formed in switching layer 302 (e.g., in response to a forming or set voltage) may be broken by the application of a reset voltage, so as to place cell 300 in a high resistance (OFF) state.

Regardless of the number of filaments 303 that are formed when a cell precursor is exposed to a forming voltage, or when cell 300 is exposed to a set voltage (i.e., when cell 300 is in an ON (LRS) state), it may be desirable to control the location and/or distribution of such filaments within switching layer 102. With this in mind, in some embodiments cell 300 (or a precursor thereof) may be configured such that filaments 303 are only formed within one or more predetermined regions of switching layer 102, such as inner region (IR). For example and as shown in FIG. 3, cell 300 may be configured such that one or a plurality of filaments 313 are only formed within the width, W1, of inner region, IR.

Figure 4:
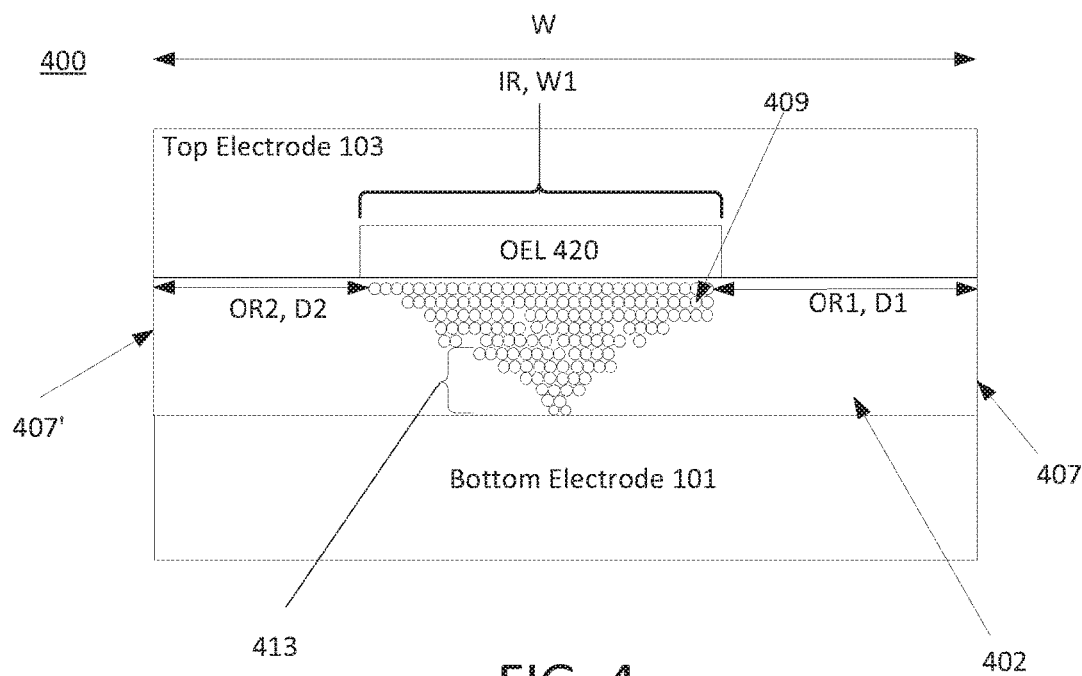
FIG. 4 depicts the structure of another example of a resistive memory cell consistent with the present disclosure.

Reference is now made to FIG. 4, which depicts the structure of another example of a resistive memory cell consistent with the present disclosure. As shown, cell 400 includes several of the same components as cell 300. For example, cell 400 includes bottom electrode 101 and top electrode 103, the features of which are the same as described above in connection with FIG. 3. In addition, cell 400 includes switching layer 402 (e.g., after execution of a forming process), which is formed on bottom electrode and includes an inner region (IR), first and second outer regions (OR1, OR2), first and second sides (407, 407') and a plurality of vacancies 409 that are localized within the inner region (IR). The features of switching layer 402 are generally the same as those described above in connection with the corresponding components of switching layer 302 in FIG. 3. A detailed description of such features is therefore not reiterated. Furthermore when a precursor of cell 400 is exposed to a forming voltage (or cell 400 is exposed to a set voltage), one or more filaments 413 may form within inner region (IR) thereof, placing cell 400 in a low resistance (ON) state. The features and characteristics of filaments 413 are generally the same as those of filaments 313, and therefore a detailed description of filaments 413 is not reiterated.

With the foregoing in mind, cell 400 differs from cell 300 in that it also includes oxygen exchange layer (OEL) 420. Consistent with the foregoing discussion, OEL 420 may include or be formed of a material that may react and/or has previously reacted with oxygen in switching layer 402 or a precursor thereof. Non-limiting examples of suitable materials that may be used to form OEL 420 include metals such as hafnium, titanium, tantalum, and combinations thereof. Of course such materials are identified for the sake of example only, and other suitable materials may be used. As may be appreciated, such materials may react with oxygen in switching layer 402 or a precursor thereof, e.g., so as to form their corresponding oxide (e.g., hafnium oxide, titanium oxide, tantalum oxide, combinations thereof, and the like).

The thickness of OEL 420 may vary considerably, and an OEL of any suitable thickness may be used. In some embodiments, the thickness of OEL 420 ranges from greater than 0 to about 20 nm, such as greater than 0 to about 15 nm, or even greater than 0 to about 10 nm.

The width of OEL 420 may vary considerably, provided it is less than the total width (W) of cell 400. Without limitation, in some embodiments OEL 420 has a width that is the same or substantially the same as the width (W1) of the inner region of (IR) of switching layer 402. Accordingly, the width of OEL 420 may range from greater than 0 to about 100 nm, such as from greater than 0 to about 30 nm, from greater than 0 to about 15 nm, or even from greater than 0 to about 10 nm. Without limitation, in some embodiments the width of OEL 420 is about 10 nm.

As will be described in detail below, OEL 420 may enable alternative methods of localizing vacancies within inner region (IR) of switching layer 402. For example instead of using a controlled oxidation process such as the one briefly described above in connection with FIG. 3, localization of oxygen vacancies within inner region (IR) of switching layer 402 may be accomplished in part by the selective formation of OEL 420 at a desired location on a precursor of switching layer 402.

More specifically and as will be described in further detail later, localization of oxygen vacancies may be accomplished by forming a precursor of switching layer 402, depositing OEL 420 on the precursor, and processing the resulting structure to react the material of OEL 420 with oxygen in the precursor of switching layer 402. In this regard, a precursor of switching layer 402 may be formed by depositing layer(s) of a substantially stoichiometric oxide (such as those noted above) on a bottom electrode 101. OEL 420 may thereafter be formed on a portion of switching layer precursor e.g., by a selective deposition or other suitable process. Top electrode 103 may thereafter be formed on OEL 420 and any exposed portion of the switching layer precursor. The resulting precursor may then be processed, e.g., with a heat treatment (e.g., annealing) process.

During or in response to the heat treatment process, OEL 420 may react with oxygen in the switching layer precursor, depleting oxygen from the substantially stoichiometric oxide forming the switching layer precursor. This reaction may be localized to the region proximate the interface between OEL 420 and the switching layer precursor. The result of this reaction may be the formation of a sub-stoichiometric oxide region containing a plurality of oxygen vacancies 409, wherein the sub-stoichiometric oxide region is disposed generally below the OEL 420. In addition, at least a portion of the oxygen reactive material in OEL 420 may be converted to a corresponding oxide, as discussed above. As the reaction between OEL 420 and oxygen in a precursor of switching layer 402 may be confined and/localized to the region proximate the interface between switching layer 402 and OEL 420 (i.e., to a region generally below OEL 420), the dimensions and placement of inner region (IR), and first and second outer regions (OR1, OR2) may be controlled by adjusting the location and/or dimensions of OEL 420. Subsequently, a forming process may be applied to cause the formation switching layer 402, which contains one or more filaments formed from vacancies 409.

Notably, the use of OEL 420 can avoid the need to use protective layers 310, to protect first and second sides 407, 407' of switching layer 402 from exposure to oxygen. This is particularly true in instances where cell 400 is formed within a trench, wherein the sidewalls of the trench may contact and protect first and second sides 407, 407' from oxygen exposure. Without limitation, in some embodiments when an OEL is used in the production of a resistive memory cell consistent with the present disclosure, protective layers such as those shown in FIG. 3 are omitted.

Another aspect of the present disclosure relates to methods of making resistive memory cells consistent with the present disclosure. In this regard reference is made to FIG. 5, which is a flow diagram of example operations of one example of a method of manufacturing a resistive memory cell of the structure shown and described above in FIG. 3. For clarity and ease of understanding, the operations of the method of FIG. 5 will be described in conjunction with FIGS. 6A-6D.

Figure 5:
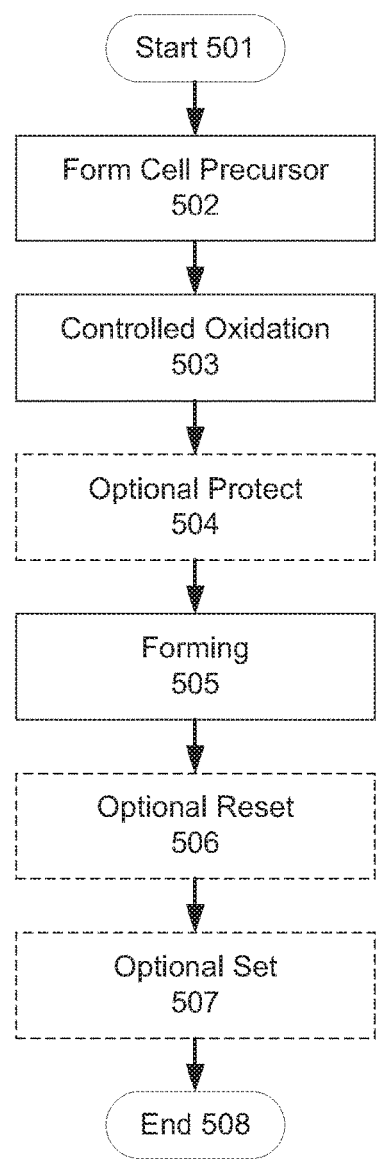
FIG. 5 is a flow chart of example operations of one method of forming a resistive memory cell consistent with the present disclosure.
Figure 6A:
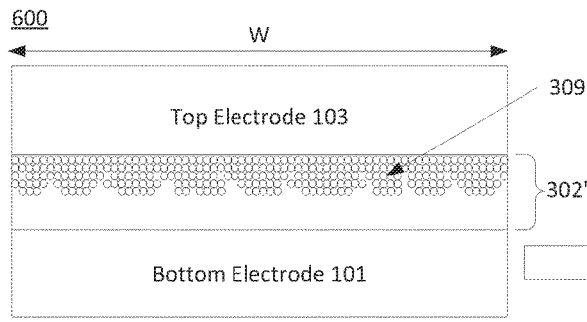
FIGS. 6A-6D stepwise illustrate the formation of a resistive memory cell consistent with the method of FIG. 5.

As shown in FIG. 5, method 500 begins at block 501. The method may then proceed to block 502, wherein a resistive memory cell precursor may be formed. One example of a suitable resistive memory cell precursor is shown in FIG. 6A. As shown, precursor 600 includes bottom electrode 101, a switching layer precursor 302' formed on bottom electrode 101, and a top electrode 103 formed on switching layer precursor 302'.

Bottom electrode 101 may be formed, for example, by depositing or otherwise forming a suitable electrode material on a substrate, e.g., on a surface thereof, within a trench formed therein, etc. Deposition of bottom electrode 101 may be carried out in any suitable manner, such as via chemical vapor deposition (CVD), physical vapor deposition (PVD), sputtering, atomic layer deposition (ALD), molecular beam epitaxy (MBE), combinations thereof, and the like.

Following the formation of bottom electrode 101, switching layer precursor 302' may be formed. In the instant case, switching layer precursor 302' may be in the form of one or more layers of a sub-stoichiometric oxide, such as those described previously. With this in mind, switching layer precursor 302' may be formed by depositing one or more layers of a sub-stoichiometric oxide on an upper surface of bottom electrode 101. Deposition of switching layer precursor 302' may be performed in any suitable manner, such as by CVD, PVD, ALD, MBE, reactive sputtering, combinations thereof, and the like. In any case, switching layer precursor 302' may include a plurality of oxygen vacancies therein. This concept is illustrated in FIG. 6A, wherein switching layer precursor 302' is illustrated as including vacancies 309.

Alternatively, switching layer precursor 302' may be formed by depositing one or more layers of stoichiometric oxide on bottom electrode 101. After such deposition, top electrode 103 may be formed over the entire surface of switching layer precursor 302, as shown in FIG. 6A. In this embodiment, top electrode may be formed from or include one or more layers of an electrode material (e.g., titanium, tungsten, etc.) that is both conductive and reactive with oxygen in switching layer precursor 302. As a result, at least a portion of top electrode 103 may act as an oxygen exchange layer (OEL). In such embodiments, heat may be applied during or after the formation of top electrode 103, so as to cause at least a portion of the material of top electrode 103 to react with oxygen in switching layer precursor 302', resulting in the formation of vacancies 309.

Although a wide variety of vacancy distributions are envisioned, in the embodiment of FIG. 6A vacancies 309 are distributed across the entire width of switching layer precursor 302', and proximate an upper surface thereof. In this case and with further reference to FIG. 5, method 500 may proceed to from block 502 to block 503 once cell precursor 600 has been provided. Pursuant to block 503, switching layer precursor 302' may be processed to form switching layer 302 having an inner region (IR) having a width (W1) and first and second outer regions (OR1, OR2), as previously described. More specifically, a controlled oxidation process may be performed to expose the first and second sides (not labeled in FIGS. 6A-6D) of switching layer precursor 302' to an atmosphere containing oxygen. As discussed above, during such exposure oxygen in the atmosphere may occupy oxygen vacancies 309 that are proximate the first and second sides of switching layer precursor 302', e.g., converting the sub-stoichiometric oxide in such region(s) to a substantially stoichiometric oxide. In contrast, vacancies within an inner region of switching layer precursor 302' may remain unaffected.

In some embodiments, the controlled oxidation process may involve exposing the sides of switching layer precursor 302' and annealing precursor 600 in an oxygen containing atmosphere so as to localize oxygen vacancies 309 within an inner region (IR) of switching layer precursor 302. In such instances, the anneal temperature may range from about 300 to about 600 degrees calcium. Non-limiting examples of a suitable oxygen containing atmosphere includes an atmosphere containing from greater than 0 to about 5% oxygen, and from about 5% to about 95% nitrogen, wherein the total pressure of the atmosphere ranges from about 0.1 to about 2 atmospheres, such as from about 0.1 to about 1 atmospheres.

Figure 6B:
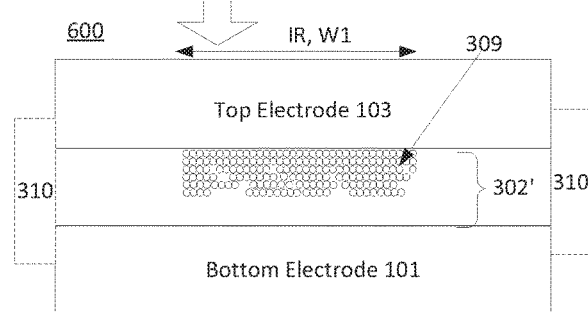

This concept is illustrated by FIG. 6B, which illustrates precursor 600 after it has been subjected to a controlled oxidation process. As shown in FIG. 6B, after controlled oxidation oxygen vacancies 309 proximate the first and second sides of switching layer precursor 302' have been occupied by oxygen, resulting in the formation of first and second outer regions including a substantially stoichiometric oxide, and an inner region (IR) in which remaining oxygen vacancies 309 are localized. In this instance, the width of the inner region (IR) may correlate to the width of the remaining oxygen vacancies in switching layer precursor 302' after the controlled oxidation process. Alternatively or additionally, where relatively few oxygen vacancies remain in a first and/or second outer region, W may correlate to the width of a continuous region of sub-stoichiometric oxide formed within switching layer precursor 302'.

In this regard, the width of the remaining oxygen vacancies (or the continuous region of sub-stoichiometric oxide) may vary considerably, and may be controlled by adjusting the parameters of the controlled oxidation process. For example if anneal time is held constant, the width of the remaining oxygen vacancies/continuous region of sub-stoichiometric oxide (and thus, W1) may decrease as the partial pressure of oxygen in the oxygen containing atmosphere is increased. Likewise if the partial pressure of oxygen in the atmosphere is held constant, the width of the remaining oxygen vacancies/continuous region of sub-stoichiometric oxide (and thus, W1) may decrease with increasing anneal time. Without limitation, in some embodiments the width of the remaining oxygen vacancies/continuous region of sub-stoichiometric oxide (and hence, W1) after the controlled oxidation process ranges from greater than 0 to about 100 nm, such as from greater than 0 to about 50 nm, from greater than 0 to about 25 nm, from greater than 0 to about 15 nm, or even from about greater than 0 to about 10 nm.

Figure 6C:
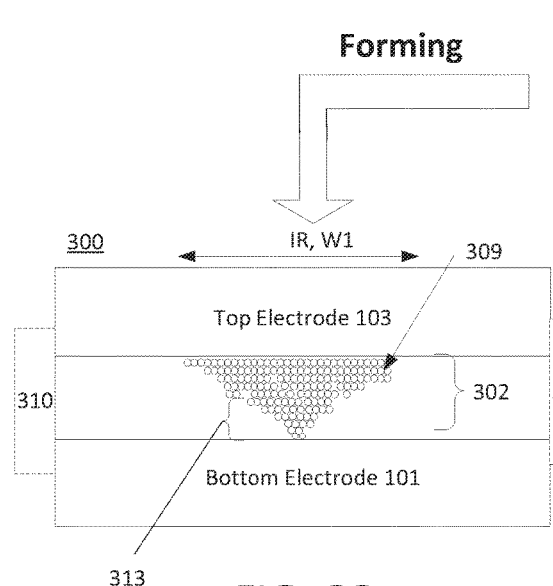
Figure 6D:
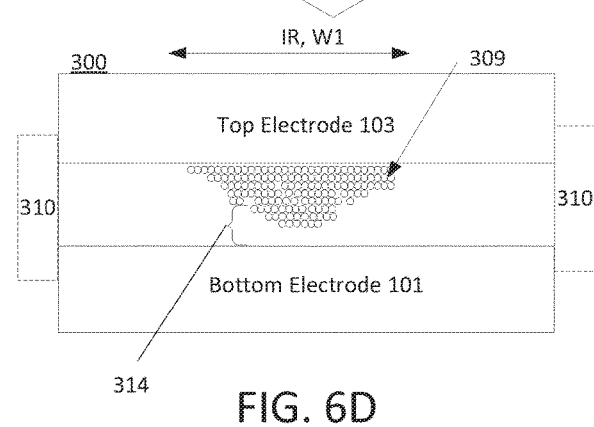

Returning to FIG. 5, after execution of the controlled oxidation process method 500 may optionally proceed to optional block 504, wherein the sides of switching layer 302 may be protected with one or more protective layers. This concept is illustrated in FIGS. 6B-D, which depict the use of protective layers 310 to insulate the sides of switching layer 302 from undesirable oxygen exposure. In this regard, protective layers 310 may be in the form of one or more layers of oxygen impermeable material (e.g., titanium nitride). When used, protective layers 310 may be deposited in any suitable manner, such as by the deposition processes mentioned above.

Once protective layers 310 are formed (or if protective layers 310 are not required), method 500 may proceed to block 505, wherein a forming process may be performed on the structure of FIG. 6B. More specifically, a forming voltage may be applied to the structure of FIG. 6B, e.g., via a voltage source connected to top electrode 103. In such embodiments and as previously described, bottom electrode 101 may be connected to ground. In response to the application of the forming voltage to switching layer precursor 302', vacancies 309 may form one or more filaments, resulting in the production of switching layer 302.

More particularly, in some embodiments application of a forming voltage may result in the formation of switching layer 302, in which one or more filaments are formed within an inner region thereof. This concept is illustrated by FIGS. 6B and 6C, which depict the formation of a resistive memory cell 300 by the application of a forming voltage. As shown in FIG. 6C, in this embodiment a switching layer 302 including a single filament 313 within inner region (IR) is created in response to the application of a forming voltage to switching layer precursor 302', but as noted above any suitable number of filaments may formed. Without limitation, switching layer precursor 302' may be configured such that in response to a forming voltage, a switching layer containing a single or limited number of filaments may be formed. In some embodiments, the formation of such filament(s) may be limited to the inner region (IR) of switching layer 302. In any case, it may be understood that filament 313 provides a low resistance pathway within switching layer 302, and thus may place resistive memory cell 300 in a low resistance (ON) state.

At this point resistive memory cell may be toggled between a low resistance (ON) and a high resistance (OFF) state by the application of a voltage, such as a reset and set voltage. In this regard, method 500 may proceed to optional block 506, pursuant to which an optional reset voltage may be applied to the structure of FIG. 6C. In general, the reset voltage may be any suitable voltage that is sufficient to break filament 313 and place the resistive memory cell in a high resistance (OFF) state. Without limitation, in some embodiments the applied reset voltage may range from less than 0 to about −12V, such as from less than 0 to about −6V, from less than 0 to about −3V, or even from less than 0 to about −1.5V. In some embodiments, a reset voltage ranging from 0 to about −1.5V may be used to break filament 313.

The foregoing concepts are illustrated in FIGS. 6C and 6D. As shown in FIG. 6C, filament 313 may extend from top electrode 103 to bottom electrode 101, thereby providing a low resistance pathway between such electrodes. As shown in FIG. 6D, upon application of a reset voltage, filament 313 may be broken to form a broken filament 314.

At this point, method 500 may proceed from optional block 506 to optional block 507, wherein a set voltage may be applied to the structure of FIG. 6D. As discussed above, a set voltage may be any voltage that is sufficient to cause the reformation of one or more filaments within switching layer 302. Without limitation, in some embodiments the applied set voltage may range from greater than 0 to about 12V, such as from greater than 0 to about 6V, from greater than 0 to about 3V, or even from greater than 0 to about 1.5V. In some embodiments, a set voltage ranging from 0 to about 1.5V may be used to reform filament 313, e.g., from broken filament 314.

Subsequent the application of a reset and/or set voltage (or if such application is not required), method 500 may proceed to block 508 and end.

Figure 7:
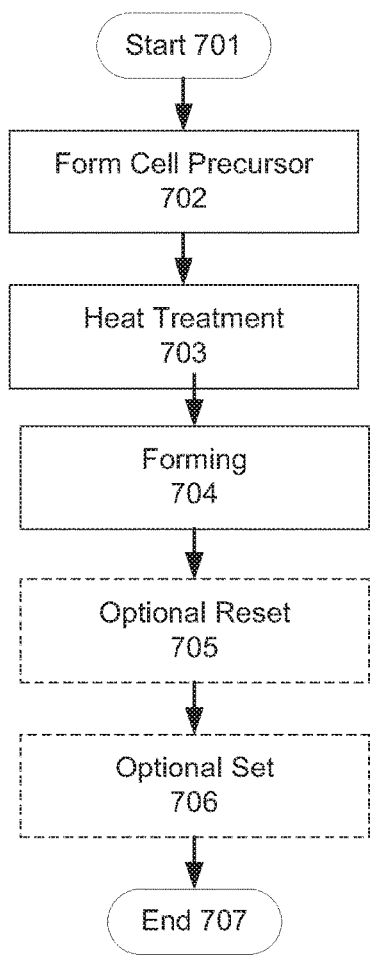
FIG. 7 is a flow chart of example operations of another method of forming a resistive memory cell consistent with the present disclosure.

Reference is now made to FIG. 7, which is a flow diagram of example operations of another method of manufacturing a resistive memory cell consistent with the present disclosure, in this case a resistive memory cell of the structure shown and described above in FIG. 4. For clarity and ease of understanding, the operations of the method of FIG. 7 will be described in conjunction with FIGS. 8A-8D.

Figure 8A:
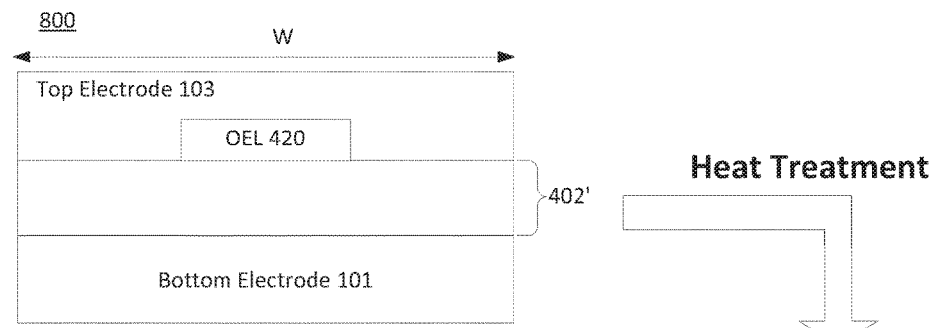
FIGS. 8A-8D stepwise illustrate the formation of a resistive memory cell consistent with the method of FIG. 7.

As shown in FIG. 7, method 700 may begin at block 701. It may then proceed to block 702, wherein a resistive memory cell precursor may be formed 702. One example of a suitable resistive memory cell precursor is shown in FIG. 8A. As shown, precursor 800 includes bottom electrode 101, a switching layer precursor 402' formed on bottom electrode 101, an oxygen exchange layer (OEL) 420 formed on a portion of the upper surface of switching layer precursor 402', and a top electrode 103 formed on switching layer precursor 402' and surrounding OEL 420.

Bottom electrode 101 of precursor 800 may be formed, for example, by depositing a suitable electrode material on a substrate, e.g., on a surface thereof, within a trench formed therein, etc. Deposition of bottom electrode 101 may be carried out in any suitable manner, such as via chemical vapor deposition (CVD), physical vapor deposition (PVD), sputtering, atomic layer deposition (ALD), molecular beam epitaxy (MBE), combinations thereof, and the like.

Following the formation of bottom electrode 101, switching layer precursor 402' may be formed. In the instant case, switching layer precursor 302' may be in the form of one or more layers of a substantially stoichiometric oxide, such as those described previously. With this in mind, switching layer precursor 402' may be formed in any suitable manner, such as by depositing layer(s) of a substantially stoichiometric oxide on an upper surface of bottom electrode 101 via CVD, PVD, ALD, MBE, reactive sputtering, combinations thereof, and the like.

OEL 420 may then be deposited or otherwise formed on at least a portion of the upper surface of switching layer precursor 402'. Although OEL 420 may be formed in any suitable manner, in some embodiments OEL 420 is formed by depositing one or more layers of an oxygen reactive material on switching layer precursor 402' via an additive deposition process, such as CVD, PVD, ALD, sputtering, combinations thereof, and the like. Without limitation, in some embodiments OEL 420 is formed by masking a portion a portion of the upper surface of switching layer precursor 402', depositing an oxygen reactive material on an unmasked portion of switching layer precursor 402', and removing the mask. Alternatively, in some embodiments OEL may be formed by depositing a conformal layer of an oxygen reactive material on the upper surface of switching layer precursor 402', and etching the conformal layer to form an OEL having desired dimensions. In any case as noted previously, in some embodiments the dimensions of OEL 420 may be the same as or similar to the dimensions of a to-be-formed inner region (IR) within a switching layer.

Top electrode 103 may then be formed, e.g., by depositing a conformal layer of electrode material on exposed surfaces of switching layer precursor 402' and OEL 420. As such, OEL 420 may be embedded between top electrode 103 and switching layer precursor 402'. With this in mind, in some embodiments of precursor 800, top electrode 103 is formed from a material that is conductive, but which does not react (or is not highly reactive) with oxygen. As may be appreciated, use of such a material may limit or prevent the materials forming top electrode 103 from reacting with oxygen in switching layer precursor 402'. That is, use of such a material may limit or prevent top electrode 103 from acting as another oxygen exchange layer. With this in mind, non-limiting examples of materials which may be used to form top electrode 103 in such embodiments include binary and ternary nitrides such as titanium nitride, tantalum nitride, titanium aluminum nitride, and tantalum aluminum nitride.

Returning to FIG. 7, once a resistive memory cell precursor (e.g., precursor 800) is provided the method may proceed from block 702 to block 703. Pursuant to block 703, the resistive memory cell precursor may be processed to form oxygen vacancies within a switching layer precursor therein.

Figure 8B:
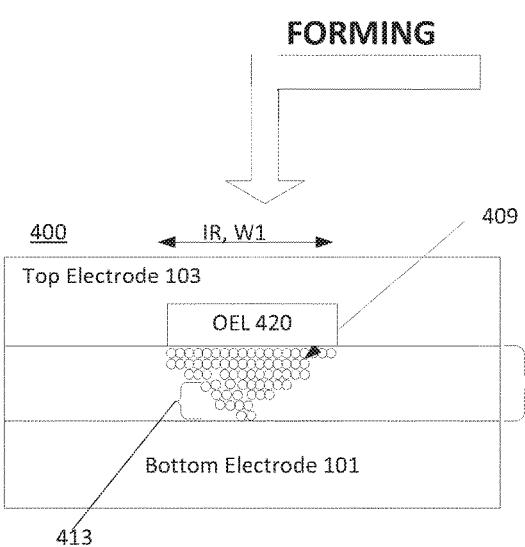

More specifically and with reference to FIGS. 8A and 8B, precursor 800 may be subjected to a heat treatment/annealing process so as to cause the material of OEL 420 to react with oxygen in switching layer precursor 402', resulting in the formation of an inner region (IR) of sub-stoichiometric oxide containing oxygen vacancies 409 within switching layer precursor 409, as generally illustrated in FIG. 8B. In some embodiments the heat treatment process involves annealing precursor 800 in an inert (e.g., nitrogen, argon, noble gas, etc.) atmosphere. Such annealing may be performed, for example, at a temperature ranging from about 200 to about 600 Celsius (e.g., about 300 to about 600 Celsius), and for a time that is sufficient to react at least a portion of the oxygen reactive material in OEL 420 with the oxygen in switching layer precursor 402'. As explained previously, such reaction may result in the formation of a (e.g., continuous) region of sub-stoichiometric oxide within switching layer precursor 402', and the conversation of the material of at least a portion of OEL 420 to a corresponding oxide.

As described above in connection with FIG. 4, the reaction between OEL 420 and the oxygen in a switching layer precursor (e.g., switching layer precursor 402') may be localized/confined to the region proximate the interface there between. As a result, the dimensions and placement of a to-be-formed inner region (IR), and adjacent first and second outer regions (OR1, OR2 (not labeled in FIGS. 8A-8D) of a switching layer may be controlled by adjusting the location and/or dimensions of OEL 420, as well as the parameters of the heat treatment process. In this manner, significant control may be exerted over the placement and dimensions of the sub-stoichiometric oxide (inner) region formed within switching layer precursor 402' by the application of the heat treatment process.

Figure 8C:
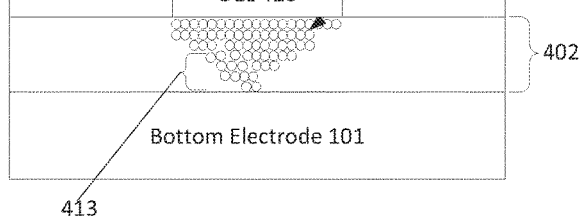

Returning to FIG. 7, following the heat treatment process the method may proceed to block 704, wherein a forming process may be applied to produce a switching layer 402 containing one or more filaments formed from vacancies 409, as generally illustrated in FIG. 8C. The forming process carried out pursuant to block 704 is the same or substantially the same as the forming process described above with regard to block 505 of FIG. 5. A detailed description of the forming process is therefore not reiterated. In general, the forming process may involve applying a forming voltage to the structure of FIG. 8B, e.g., e.g., via a voltage source connected to top electrode 103. In response to the application of the forming voltage, vacancies 409 may form one or more filaments 413 within the resulting switching layer 402, as previously described and generally shown in FIG. 8C.

It is noted that while FIG. 8C illustrates an embodiment in which a single filament 413 is created within inner region (IR) of switching layer 402, such illustration is for the sake of example only and any suitable number of filaments may formed. Without limitation, switching layer precursor 402' may be configured such that in response to a forming voltage, a single or limited number of filaments may be formed in switching layer 402. In some embodiments, the formation of such filament(s) may be confined/limited to the inner region (IR) of switching layer 402. In any case, it may be understood that filament 413 provides a low resistance pathway within switching layer 402, and thus may place resistive memory cell 400 in a low resistance (ON) state.

Figure 8D:
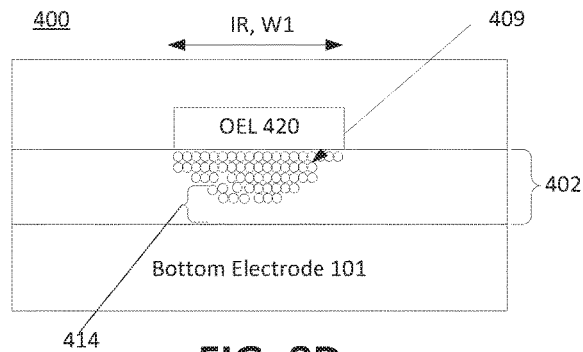

At this point resistive memory cell 400 may be toggled between a low resistance (ON) and a high resistance (OFF) state by the application of a voltage, such as a reset and set voltage. Accordingly, method 700 may proceed to optional blocks 705 and 706, pursuant to which optional reset and set voltages may be applied to the resistive memory cell 400 of FIG. 8C. The details of applying a reset and/or set voltage to resistive memory cell 400 are the same or substantially the same as described above in connection with optional blocks 506 and 507 of FIG. 5. Such details are therefore not reiterated herein for the sake of brevity. In any case, application of a reset voltage may cause filament 413 to break, resulting in broken filament 414, as illustrated in FIG. 8D. Subsequent application of a set voltage may cause the reformation of filament 413.

Figure 9:
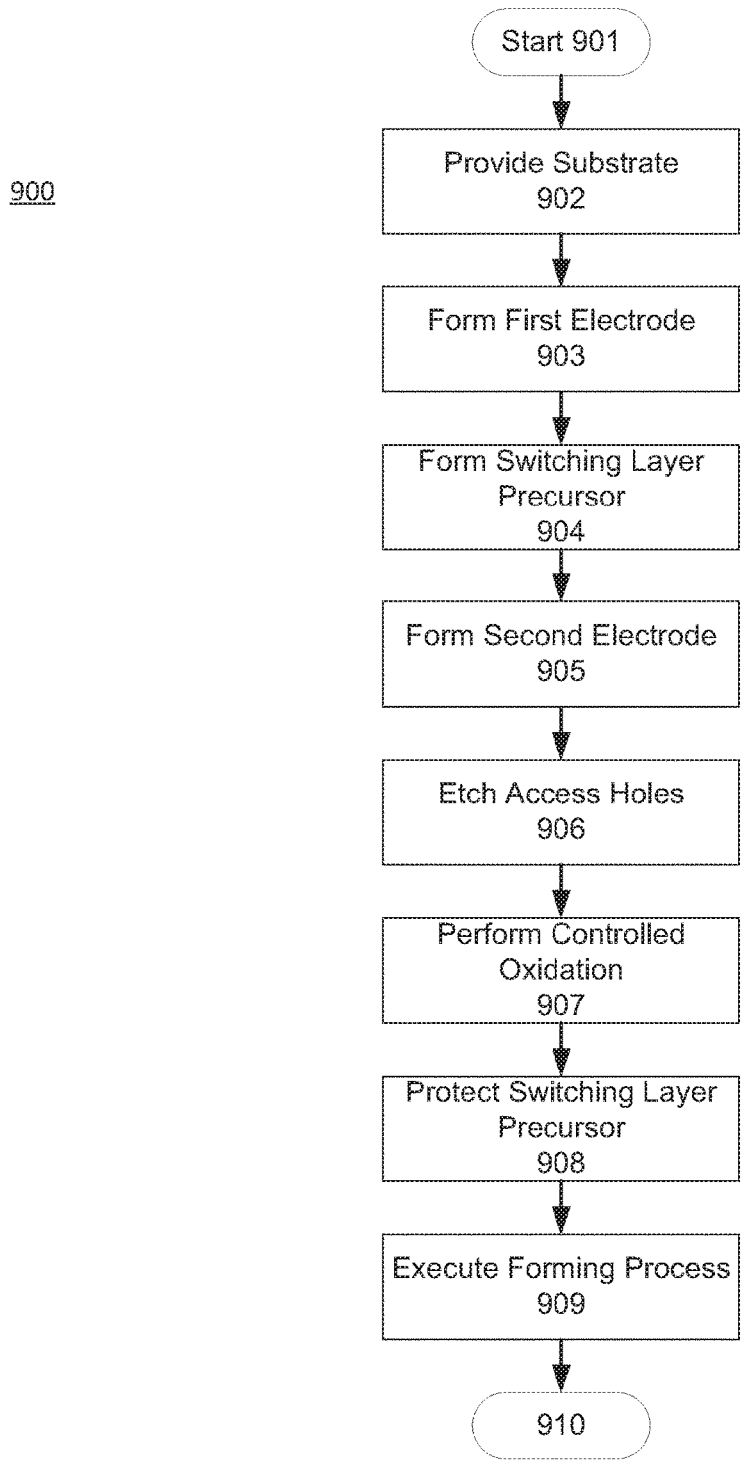
FIG. 9 is a flow chart of example operations of a method of forming an integrated circuit consistent with the present disclosure.

To further explain the above concepts the present disclosure will now proceed to describe one example of a specific process of forming a resistive memory cell in the context of an integrated circuit, a resistive random access memory, or another device. Reference is therefore made to FIG. 9, which is a flow diagram of example operations of a method of forming a resistive memory cell consistent with the present disclosure. For clarity, the operations of FIG. 9 will be described in connection with FIGS. 10A-10G, which stepwise illustrate the formation of resistive memory cell consistent with the present disclosure on a substrate, such as a substrate of an integrated circuit device.

As shown in FIG. 9, method 900 may begin at block 901. The method may then proceed to block 902, wherein a substrate for the subsequent formation of resistive memory cells may be provided. This concept is generally shown FIG. 10A, which depicts a substrate 1001 having a trench 1002 formed therein. In general, substrate 1001 may include or be in the form of one or more layers of dielectric or insulating material. Non-limiting examples of suitable dielectric/insulating materials that may be used to form substrate 1001 include insulating oxides such as silicon dioxide ($SiO_2$), carbon doped oxide (CDO), silicon nitride (SiN), organic polymers such as polyflurocyclobutane or polytetrafluoroethylene (PTFE), fluorosilicate glass (FSG), organosilicates such as silsesquioxane and siloxane, organosilicate glass, combinations thereof, and the like. Trench 1002 may be formed in substrate 1001 in any suitable manner. For example, trench 1002 may be formed by etching substrate 1001 with a selective etching process.

Figure 10A:
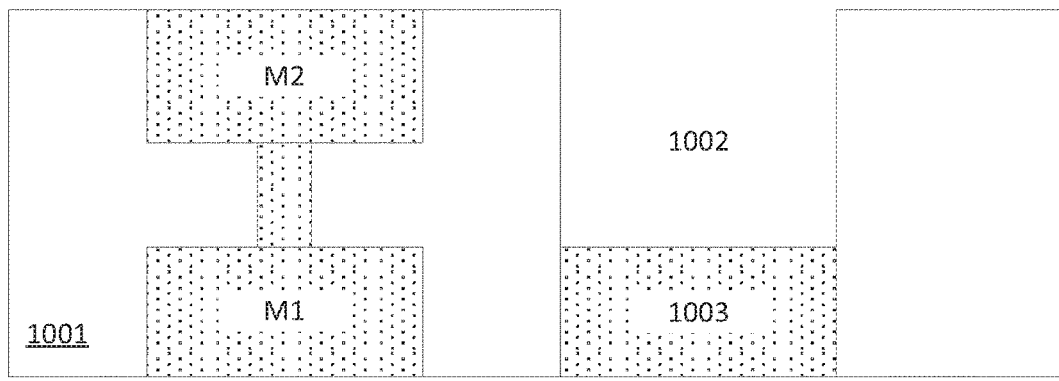
FIGS. 10A-10G stepwise illustrate the formation of an integrated circuit consistent with the method of FIG. 9.

As further shown in FIG. 10A, two levels of interconnects (M1, M2) are formed in substrate 1001. In addition, an interconnect 1003 is formed within trench 1002. As shown, interconnects M1, M2 and 1003 are surrounded by the dielectric/insulating material(s) forming substrate 1001. Interconnects M1, M2, and 1003 may be formed from conductive materials (e.g., metals such as copper, cobalt, molybdenum, rhodium, beryllium, chromium, manganese, aluminum, silver, gold, combinations thereof, and the like), which may be deposited or otherwise formed in any suitable manner (e.g., via a metallization process). The dimensions of trench 1002, interconnects M1, M2 and 1003 may be tailored to a given target application or end use. Although not shown, interconnect 1003 in some embodiments may be connected or otherwise coupled to electrical ground.

Although only one trench 1002 is depicted in FIG. 10A, it should be understood that such illustration is for the sake of example only and that any suitable number of trenches 1002 may be formed. Indeed the present disclosure envisions embodiments in which a plurality (e.g., hundreds, thousands, millions, or even billions) of trenches 1002 are formed in substrate 1001, wherein each trench is to house a resistive memory cell.

Figure 10B:
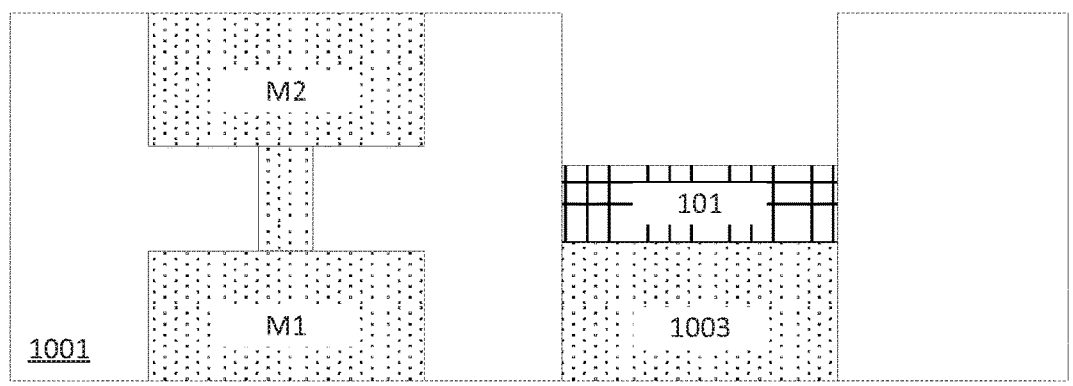

Returning to FIG. 9, the method may proceed from block 902 to block 903, pursuant to which a bottom electrode may be formed. This concept is shown in FIG. 10B, which depicts bottom (first) electrode 101 as being formed within trench 1002, and in this case on an upper surface of interconnect 1003. Bottom electrode may be formed from or include electrode materials such as those described above, and may be deposited in any suitable manner. In this example, a conformal deposition process may be used to form a conformal layer of bottom electrode 101 over the surface of substrate 1001 and within trench 1002. Following such deposition, a planarization process may be applied to remove the portion of the conformal layer from the regions of substrate 1001 outside of trench 1002. If necessary, a selective etching process may then be applied to etch bottom electrode 101 within trench 1002 to a desired thickness, and/or to remove portions of bottom electrode 101 that may be formed on the sidewalls of trench 1002.

Figure 10C:
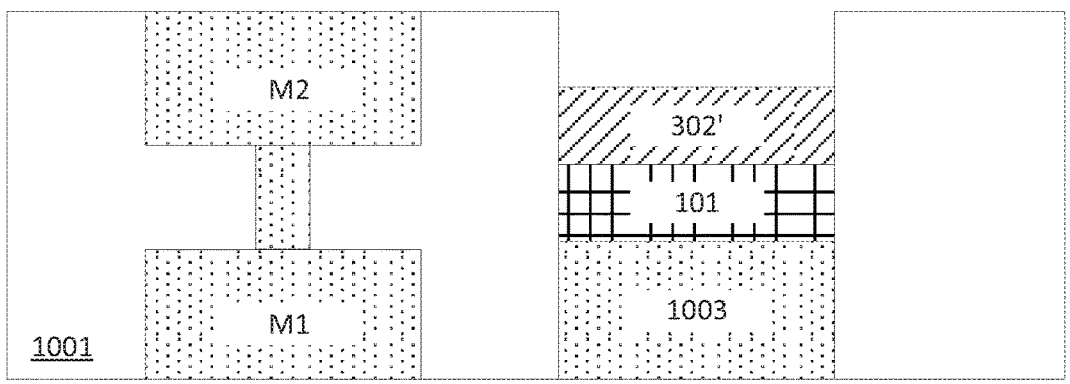

Returning to FIG. 9, the method may proceed from block 903 to block 904, pursuant to which a switching layer precursor may be formed. This concept is shown in FIG. 10C, which depicts the formation of switching layer precursor 302' within trench 1002. As noted previously switching layer precursor 302' may be or may include one or more layers of sub-stoichiometric oxide, which may be intrinsically formed as switching layer precursor 302' is deposited, or which may be formed subsequent to such deposition. Thus for example, switching layer precursor 302' may be formed by depositing a conformal layer of a sub-stoichiometric oxide on bottom electrode 101 and the surface of substrate 1001, e.g., via a reactive sputtering or other suitable deposition process. Alternatively or additionally, switching layer precursor may be formed by depositing a conformal layer of a substantially stoichiometric oxide on bottom electrode 101 and substrate 1001, depositing a conformal layer of oxygen reactive material (e.g., an OEL layer) on the conformal layer of stoichiometric oxide, and heat treating the resulting structure to react the conformal layer of oxygen reactive material with oxygen in the layer of substantially stoichiometric oxide. In either case, a planarization process may be applied to remove the deposited conformal layer(s) from the upper surface of substrate 1001. A selective etching or other removal process may also be applied to remove deposited switching layer precursor material from the sidewall of trench 1002, resulting in the structure of FIG. 10C.

Figure 10D:
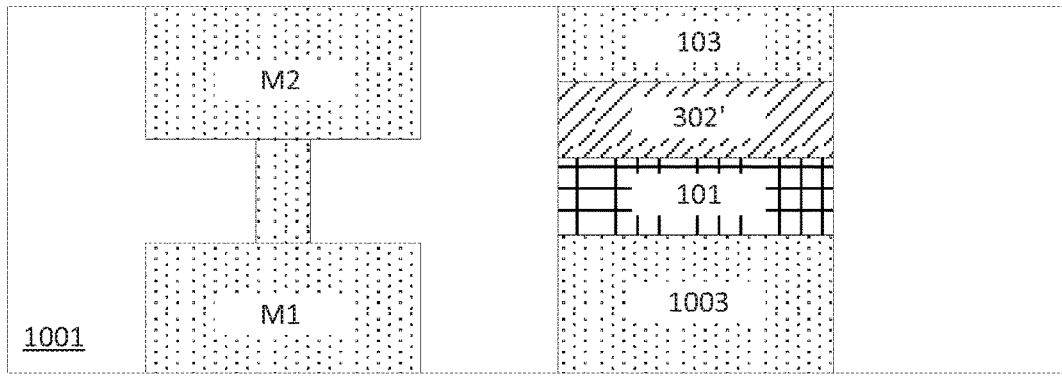

Returning again to FIG. 9, the method may proceed from block 904 to block 905, wherein a top electrode may be formed on the switching layer precursor. This concept is illustrated in FIG. 10D, which illustrates the formation of top electrode 103 on an upper surface of switching layer precursor 302'. The nature of the materials that may be used to form top electrode 103 have been previously described, and so are not reiterated Likewise, top electrode 103 may be formed in much the same manner as bottom electrode 102. Thus for example, top electrode 103 may be formed by a metallization process that creates a conformal layer of electrode material on substrate 1001 and the upper surface of switching layer precursor 302'. Planarization and/or etching processes may then be used to remove electrode material from the surface of substrate 1001 and, if desired/necessary, from the sidewalls of trench 1002, resulting in the production of the structure shown in FIG. 10D.

Figure 10E:
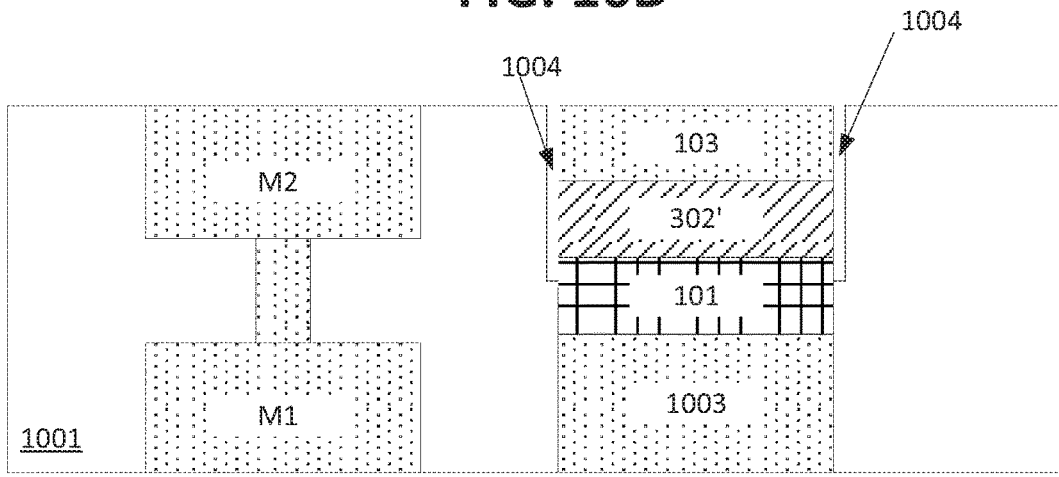

Turning again to FIG. 9, the method may proceed from block 905 to block 906, wherein access holes may be formed to expose the sides of switching layer precursor 302'. This concept is illustrated in FIG. 10E, which illustrates the formation of access holes 1004. In this example, access holes 1004 are shown as extending from an upper surface of substrate 1001 that is proximate top electrode 103 to the first and second sides (not labeled) of switching layer precursor 302'. It should be understood that the location and configuration of access holes 1004 in FIG. 10E is for the sake of example only, and that access holes 1004 may be formed in any suitable location and have any suitable configuration. In some embodiments, access holes 1004 may be formed using a selective etching or other material removal process (e.g., photolithography, wet/dry etching, etc.), which may remove material of substrate 1001 and expose the sides of switching layer precursor 302'.

The dimensions of access holes 1004 may vary considerably, and may be targeted to suit a particular application or end use. With this in mind and as will be described below, access holes 1004 may be used in a controlled oxidation process to expose the sides of switching layer precursor 302' to an atmosphere containing oxygen. As such, the degree to which the sides of switching layer precursor 302' are exposed to the oxygen containing atmosphere may be affected by the dimensions of access holes 1004. With this in mind, in some embodiments access holes 1004 have an average width ranging from about 5 nm to about 50 nm, such as about 5 to about 25 nm, or even about 5 to about 10 nm.

Returning to FIG. 9, the method may proceed from block 906 to block 907, whereupon a controlled oxidation process may be performed on the structure of FIG. 10E. As discussed above, the controlled oxidation process in some embodiments involves exposing the sides of a switching layer precursor to an atmosphere containing oxygen, and annealing the structure while the sides of the precursor are so exposed. In some embodiments, the structure of FIG. 10E is annealed at a temperature ranging from about 300 to about 600 degrees in an atmosphere containing about 5% oxygen and about 95% nitrogen. Consistent with the previous discussion, the controlled oxidation process may cause oxygen vacancies proximate the sides of switching layer precursor 302' to be occupied by oxygen, resulting in the formation of an inner region (IR) and adjacent first and second outer regions, wherein oxygen vacancies are located within the inner region (IR).

Figure 10F:
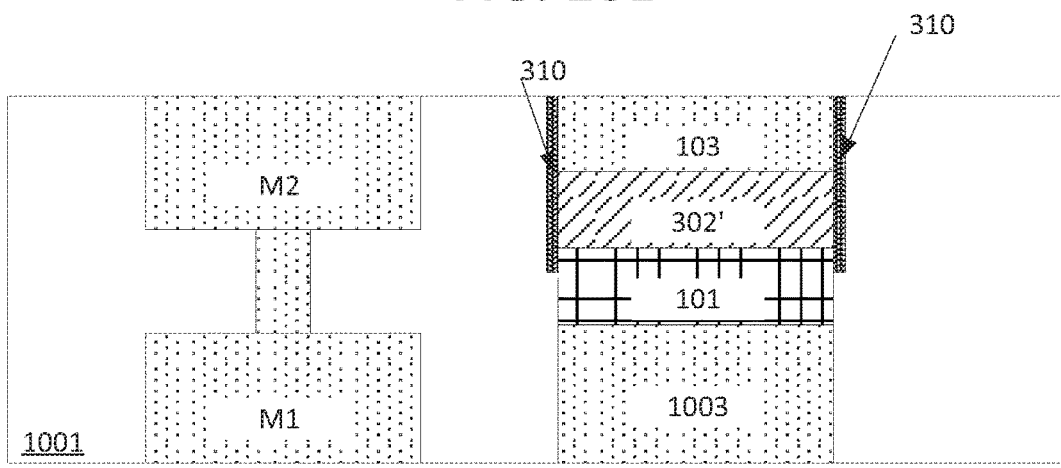

The method may then proceed from block 907 to block 908, wherein the switching layer precursor may be protected. Protection of the switching layer precursor may be performed, for example, by filling all or a portion of the access holes formed pursuant to block 906 with an oxygen impermeably material. This concept is shown in FIG. 10F, which depicts access holes 1004 as being filled with a layer 310 of oxygen impermeable material (e.g., TiN). Access holes 1004 may be fully or partially filled with oxygen impermeable material in any suitable manner. For example, access holes 1004 may be filled with oxygen impermeable material by depositing a conformal layer of oxygen impermeable material over the surface of substrate 1001 and within access holes 1004. Planarization and/or etching processes may then be used to remove oxygen impermeable material from the surface of substrate 1001, resulting in the production of the structure shown in FIG. 10F.

Figure 10G:
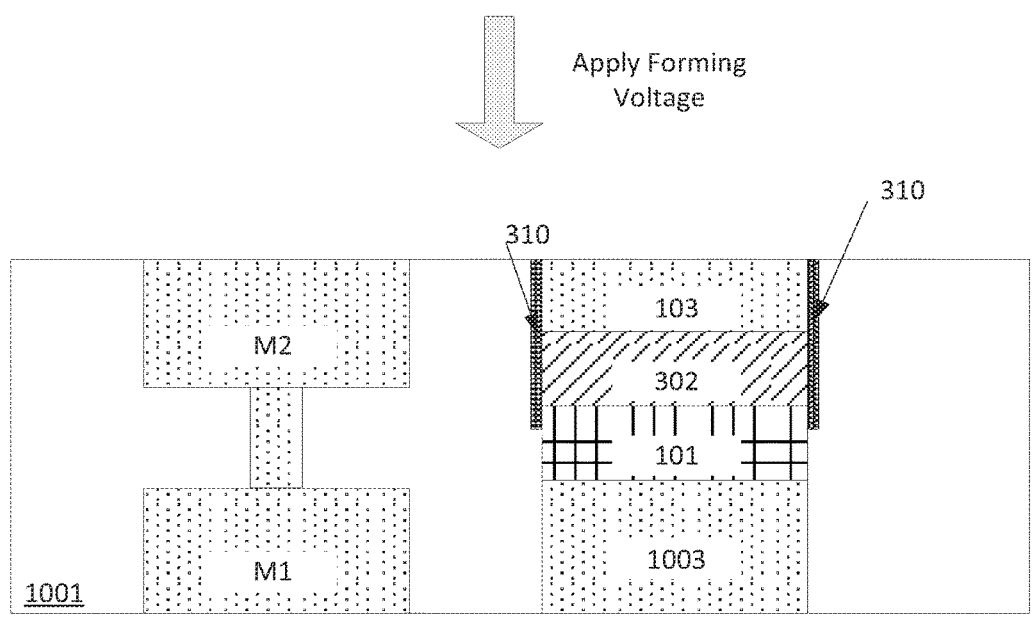

At this point the method may proceed from block 908 to block 909, wherein a forming process may be executed to convert the switching layer precursor to a switching layer consistent with the present disclosure. Thus for example, a voltage source coupled to top electrode 103 may be used to apply a forming voltage to the structure of FIG. 10F, resulting in the production of a switching layer having an inner region including one or more filaments formed of oxygen vacancies, e.g., as generally shown in FIG. 3. This concept is shown in FIG. 10G, which generally depicts the formation of conversion of switching layer precursor 302' to switching layer 302. At this point, the method may proceed to block 910 and end.

Subsequent the forming process, reset and set voltages may optionally be applied to break and reform filaments within the switching layer 302, as previously described. In this manner, the produced resistive memory cell may be toggled between low resistance (ON) and high resistance (OFF) states, as desired.

Figure 11:
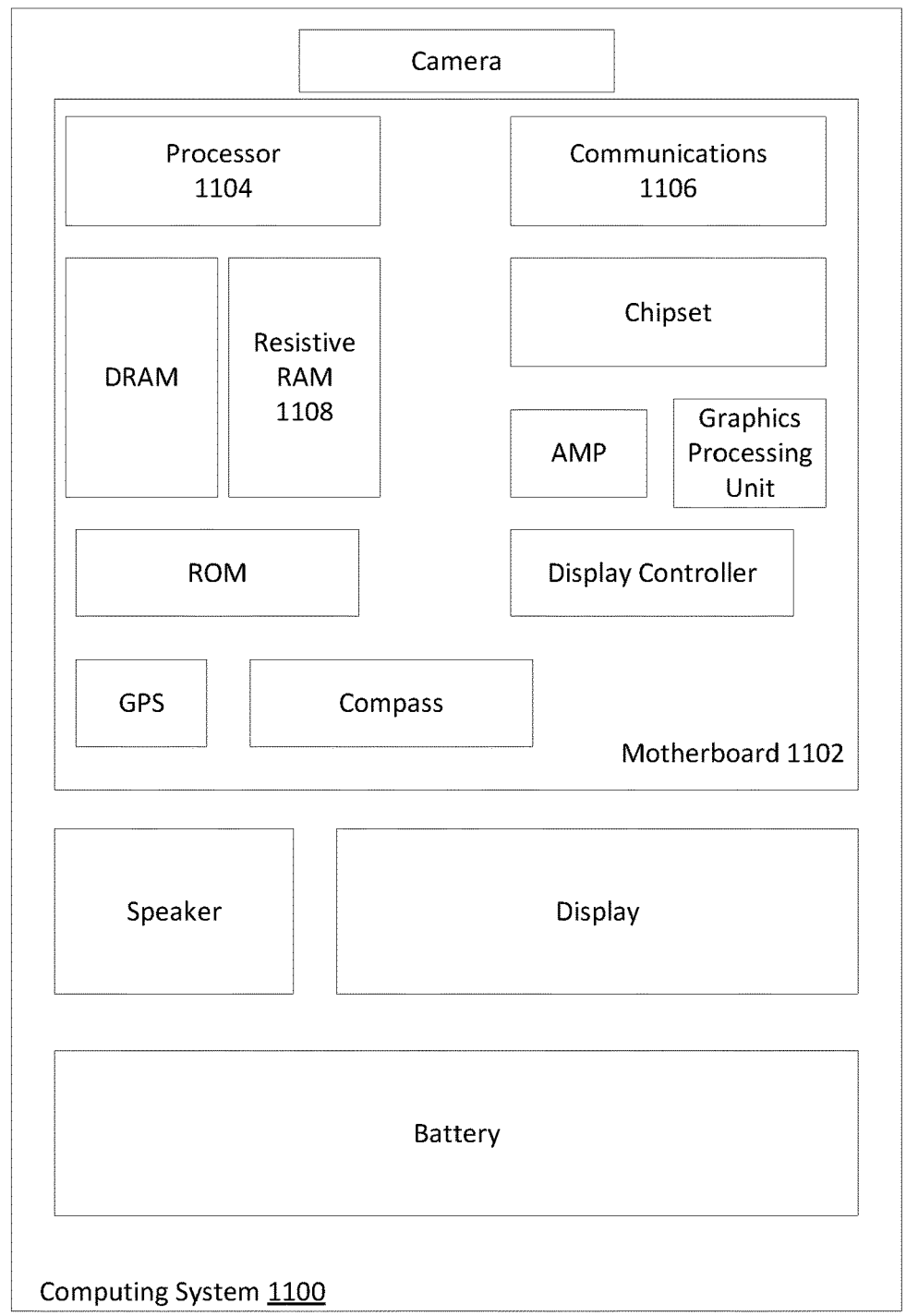
FIG. 11 depicts one example of a computing system including a resistive memory including one or more resistive memory cells consistent with the present disclosure.

Another aspect of the present disclosure relates to computing systems including an integrated circuit (e.g., a resistive memory device) including resistive memory cells consistent with the present disclosure. In this regard reference is made to FIG. 11, which illustrates a computing system 1100 implemented with integrated circuit 30 structures or devices formed using the techniques disclosed herein, in accordance with an example embodiment. As can be seen, the computing system 1100 houses motherboard 1102. Motherboard 1102 may include a number of components, including, but not limited to, processor 1104 and at least one communication chip 1106, each of which can be physically and electrically coupled to motherboard 1102, or otherwise integrated therein. As will be appreciated, motherboard 1102 may be, for example, any printed circuit board, whether a main board, a daughterboard mounted on a main board, or the only board of system 1100, etc.

Depending on its applications, computing system 1100 may include one or more other components that may or may not be physically and electrically coupled to the motherboard 1002. These other components may include, but are not limited to, volatile memory (e.g., DRAM), non-volatile memory (e.g., ROM, ReRAM 1108, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1100 may include one or more integrated circuit structures or devices (e.g., one or more resistive memory cells) formed using the techniques described herein.

Communication chip 1106 enables wireless communications for the transfer of data to and from the computing system 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1106 may implement any of a number of wireless standards or protocols, including, but not limited to, Wi-Fi (IEEE 802.11 family), WiMAX (IEEE 802.16 family), IEEE 802.20 , long term evolution (LTE), Ev-25 DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1100 may include a plurality of communication chips 1006. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

Processor 1104 of the computing system 1100 includes an integrated circuit die packaged therein. In some embodiments, the integrated circuit die of processor 1104 includes onboard circuitry that is implemented with one or more integrated circuit structures or devices (e.g., one or more resistive memory cells) consistent with the present disclosure. The term "processor" may refer to any device or portion of a device that processes, for instance, electronic data from registers and/or memory to transform that electronic data into other electronic data that may be stored in registers and/or memory.

Communication chip 1106 also may include an integrated circuit die packaged within the communication chip 1106. In accordance with some example embodiments, the integrated circuit die of communication chip 1106 includes one or more integrated circuit structures or devices (e.g., one or more resistive memory cells) consistent with the present disclosure.

In various implementations, computing device 1100 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more non-planar resistive memory cells) consistent with the present disclosure.

EXAMPLES

The following examples enumerate additional embodiments consistent with the present disclosure.

Example 1

According to this example there is provided a method of forming a resistive memory cell, including: forming a first electrode; forming a switching layer precursor having a total width, W, on the first electrode, the switching layer precursor including first and second sides; forming a second electrode on the switching layer precursor; and processing the switching layer precursor to form an inner region and first and second outer regions adjacent the inner region, wherein after the processing: the inner region includes a sub-stoichiometric oxide including a plurality of oxygen vacancies; the inner region has a width, W1, that is less than the total width, W, of the switching layer; and the first and second outer regions each comprise a substantially stoichiometric oxide; executing a forming process to form a switching layer including at least one filament, wherein the at least one filament is present only within the width W1 of the inner region.

Example 2

This example includes any or all of the features of example 1, wherein: forming the switching layer precursor includes depositing a layer of the sub-stoichiometric oxide on the first electrode; and the processing includes exposing the first and second sides of the switching layer precursor to an atmosphere containing oxygen, so as to occupy at least a portion of oxygen vacancies in the layer of the sub-stoichiometric oxide that are proximate the first and second sides of the switching layer with oxygen, so as to form the inner region and the first and second outer regions.

Example 3

This example includes any or all of the features of example 2, and further includes forming a protective layer on the first and second sides of the switching layer precursor.

Example 4

This example includes any or all of the features of example 3, wherein the protective layer includes an oxygen impermeable material.

Example 5

This example includes any or all of the features of example 4, wherein the protective layer is a binary or ternary metal nitride, a metal carbide, or a combination thereof.

Example 6

This example includes any or all of the features of example 2, wherein the processing further includes heat treating the switching layer precursor in the atmosphere containing oxygen.

Example 7

This example includes any or all of the features of example 6, wherein the heat treating is performed at a temperature ranging from about 300 to about 600 C.

Example 8

This example includes any or all of the features of example 2, and further includes providing a substrate including a dielectric material having a trench formed therein, wherein: forming the switching layer precursor includes depositing a layer of a sub-stoichiometric oxide within the trench, such that the first and second sides of the switching layer precursor respectively contact opposing sidewalls of the trench; and the exposing includes forming one or more access holes in the dielectric to expose at least a portion of the first and second sides of the switching layer precursor, and heat treating the resulting structure in the atmosphere including oxygen.

Example 9

This example includes any or all of the features of example 1, and further includes forming an oxygen exchange layer (OEL) on the switching layer precursor such that at least a portion of the OEL is between the second electrode and the switching layer precursor, wherein after the processing, the inner region is disposed below the OEL.

Example 10

This example includes any or all of the features of example 9, wherein the OEL has a width corresponding to W1.

Example 11

This example includes any or all of the features of example 9, wherein: forming the switching layer precursor includes depositing a layer of a substantially stoichiometric oxide on the first electrode; and the processing includes heat treating the OEL and the switching layer precursor so as to form the inner region substantially beneath the OEL

Example 12

This example includes any or all of the features of example 1, wherein W1 is an average width and ranges from greater than 0 to about 40 nanometers (nm).

Example 13

This example includes any or all of the features of example 12, wherein W1 ranges from greater than 0 to about 10 nm.

Example 14

This example includes any or all of the features of example 9, wherein the OEL includes a metal selected from the group consisting of hafnium (Hf), titanium (Ti), tantalum (Ta), or one or more combinations thereof.

Example 15

This example includes any or all of the features of example 1, wherein the sub-stoichiometric oxide is formed from a sub-stoichiometric metal oxide selected from the group consisting of sub-stoichiometric: hafnium oxide ($HfO_{2-x}$), tantalum oxide ($Ta_2O_{5-x}$), nickel oxide ($NiO_{2-x}$), tungsten (III) oxide ($W_2O_{3-x}$), tungsten (IV) oxide ($WO_{2-x}$), tungsten (IV) oxide ($WO_{3-x}$), tungsten pentoxide ($W_2O_{5-x}$), titanium oxide ($TiO_{2-x}$), zirconium oxide ($ZrO_{2-x}$), vanadium oxide ($VO_{2-x}$), copper (II) oxide ($CuO_{1-x}$), aluminum oxide ($Al_2O_{3-x}$), or one or more combinations thereof, wherein x is greater than or equal to about 25% of the fully stoichiometric oxygen content of the corresponding stoichiometric oxide.

Example 16

This example includes any or all of the features of example 1, wherein: a first side of the inner region is spaced from the first side of the switching layer by a distance D1; a second side of the inner region is spaced from the second side of the switching layer by a distance D2; D1 and D2 may be the same or different; and D1 and D2 each range from greater than 0 to about 50 nm.

Example 17

This example includes any or all of the features of example 1, wherein: the forming process causes the oxygen vacancies to form a single filament within the inner region.

Example 18

This example includes any or all of the features of example 1, wherein after execution of the forming process, the method further includes executing a reset process to break the at least one filament.

Example 19

This example includes any or all of the features of example 18, wherein after execution of the reset process, the method further includes executing a set process to reform the filament within the inner region.

Example 20

According to this example there is provided a including: a first electrode; a switching layer having a total width, W, formed on the first electrode; a second electrode formed on the switching layer; wherein: the switching layer includes first side, a second side, an inner region, and first and second outer regions adjacent the inner region, the inner region including a sub-stoichiometric oxide, the first and second outer regions including a substantially stoichiometric oxide; and the inner region has a width, W1, that is less than a total width, W, of the switching layer.

Example 21

This example includes any or all of the features of example 20, wherein the sub-stoichiometric oxide includes a plurality of oxygen vacancies.

Example 22

This example includes any or all of the features of example 21, wherein the resistive memory cell is reconfigurable between an ON and OFF condition in response to an applied voltage; and when the resistive memory cell is in the ON condition, at least a portion of the plurality of oxygen vacancies form at least one filament only within said width, W1, of said inner region.

Example 23

This example includes any or all of the features of example 22, wherein when the resistive memory cell is in the OFF condition, the at least one filament is broken.

Example 24

This example includes any or all of the features of example 20, and further includes a protective layer on the first and second sides of the switching layer.

Example 25

This example includes any or all of the features of example 24, wherein the protective layer includes an oxygen impermeable material.

Example 26

This example includes any or all of the features of example 25, wherein the oxygen impermeable material is a binary or ternary metal nitride, a metal carbide, or a combination thereof.

Example 27

This example includes any or all of the features of example 20, and further includes a substrate including a dielectric material having a trench formed therein, the trench including opposing sidewalls, wherein the first electrode, second electrode, and switching layer are formed within the trench.

Example 28

This example includes any or all of the features of example 27, and further includes first and second access holes extending to the first and second sides of the switching layer, respectively, wherein the first and second access holes are at least partially filled with an oxygen impermeable material.

Example 29

This example includes any or all of the features of example 28, wherein the oxygen impermeable material is a binary or ternary metal nitride, a metal carbide, or a combination thereof.

Example 30

This example includes any or all of the features of example 20, further including an oxygen exchange layer (OEL) formed on the switching layer such that at least a portion of the OEL is between the second electrode and the switching layer, wherein the inner region is disposed below the OEL.

Example 31

This example includes any or all of the features of example 30, wherein the OEL has a width corresponding to W1.

Example 32

This example includes any or all of the features of example 20, wherein W1 is an average width and ranges from greater than 0 to about 40 nanometers (nm).

Example 33

This example includes any or all of the features of example 32, wherein W1 ranges from greater than 0 to about 10 nm.

Example 34

This example includes any or all of the features of example 30, wherein the OEL includes a metal selected from the group consisting of hafnium (Hf), titanium (Ti), tantalum (Ta), one or more combinations thereof, or one or more oxides thereof.

Example 35

This example includes any or all of the features of example 20, wherein the sub-stoichiometric oxide is selected from the group consisting of sub-stoichiometric: hafnium oxide ($HfO_{2-x}$), tantalum oxide ($Ta_2O_{5-x}$), nickel oxide ($NiO_{2-x}$), tungsten (III) oxide ($W_2O_{3-x}$), tungsten (IV) oxide ($WO_{2-x}$), tungsten (IV) oxide ($WO_{3-x}$), tungsten pentoxide ($W_2O_{5-x}$), titanium oxide ($TiO_{2-x}$), zirconium oxide ($ZrO_{2-x}$), vanadium oxide ($VO_{2-x}$), copper (II) oxide ($CuO_{1-x}$), aluminum oxide ($Al_2O_{3-x}$), or one or more combinations thereof, wherein x is greater than or equal to about 25% of the fully stoichiometric oxygen content of the corresponding stoichiometric oxide.

Example 36

This example includes any or all of the features of example 20, wherein: a first side of the inner region is spaced from the first side of the switching layer by a distance D1; a second side of the inner region is spaced from the second side of the switching layer by a distance D2; D1 and D2 may be the same or different; and D1 and D2 each range from greater than 0 to about 50 nanometers.

Example 37

This example includes any or all of the features of example 20, wherein when the resistive memory cell is in the ON condition, the switching layer includes a single filament within the width, W1, of the inner region.

Example 38

According to this example there is provided a computing device comprising a processor and a memory, the memory comprising at least on resistive memory cell, the resistive memory cell including: a first electrode; a switching layer having a total width, W, formed on the first electrode; a second electrode formed on the switching layer; wherein: the switching layer includes a first side, a second side, an inner region, and first and second outer regions adjacent the inner region, the inner region includes a sub-stoichiometric oxide, the first and second outer regions include a substantially stoichiometric oxide; and the inner region has a width, W1, that is less than a total width, W, of the switching layer.

Example 39

This example includes any or all of the features of example 38, wherein the sub-stoichiometric oxide includes a plurality of oxygen vacancies.

Example 40

This example includes any or all of the features of example 39, wherein the resistive memory cell is reconfigurable between an ON and OFF condition in response to an applied voltage; and when the resistive memory cell is in the ON condition, at least a portion of the plurality of oxygen vacancies form at least one filament only within the width, W1, of the inner region.

Example 41

This example includes any or all of the features of example 40, wherein when the resistive memory is in the OFF condition, said at least one filament is broken.

Example 42

This example includes any or all of the features of example 38, and further includes a protective layer on the first and second sides of the switching layer.

Example 43

This example includes any or all of the features of example 38, wherein the protective layer includes an oxygen impermeable material.

Example 44

This example includes any or all of the features of example 43, wherein the oxygen impermeable material is a binary or ternary metal nitride, a metal carbide, or a combination thereof.

Example 45

This example includes any or all of the features of example 38, wherein the resistive memory cell further includes a substrate including a dielectric material having a trench formed therein, the trench including opposing sidewalls, wherein the first electrode, second electrode, and switching layer are formed within the trench.

Example 46

This example includes any or all of the features of example 45, wherein the resistive memory cell further includes first and second access holes extending to the first and second sides of the switching layer, respectively, wherein the first and second access holes are at least partially filled with an oxygen impermeable material.

Example 47

This example includes any or all of the features of example 46, wherein the oxygen impermeable material is a binary or ternary metal nitride, a metal carbide, or a combination thereof.

Example 48

This example includes any or all of the features of example 38, wherein the resistive memory cell further includes an oxygen exchange layer (OEL) formed on the switching layer such that at least a portion of the OEL is between the second electrode and the switching layer, wherein the inner region is disposed below the OEL.

Example 49

This example includes any or all of the features of example 48, wherein the OEL has a width corresponding to W1.

Example 50

This example includes any or all of the features of example 38, wherein W1 is an average width and ranges from greater than 0 to about 40 nanometers (nm).

Example 51

This example includes any or all of the features of example 50, wherein W1 ranges from greater than 0 to about 10 nm.

Example 52

This example includes any or all of the features of example 48, wherein the OEL includes a metal selected from the group consisting of hafnium (Hf), titanium (Ti), tantalum (Ta), one or more combinations thereof, or one or more oxides thereof.

Example 53

This example includes any or all of the features of example 38, wherein the sub-stoichiometric oxide is selected from the group consisting of sub-stoichiometric: hafnium oxide ($HfO_{2-x}$), tantalum oxide ($Ta_2O_{5-x}$), nickel oxide ($NiO_{2-x}$), tungsten (III) oxide ($W_2O_{3-x}$), tungsten (IV) oxide ($WO_{2-x}$), tungsten (IV) oxide ($WO_{3-x}$), tungsten pentoxide ($W_2O_{5-x}$), titanium oxide ($TiO_{2-x}$), zirconium oxide ($ZrO_{2-x}$), vanadium oxide ($VO_{2-x}$), copper (II) oxide ($CuO_{1-x}$), aluminum oxide ($Al_2O_{3-x}$), or one or more combinations thereof, wherein x is greater than or equal to about 25% of the fully stoichiometric oxygen content of the corresponding stoichiometric oxide.

Example 54

This example includes any or all of the features of example 38, wherein: a first side of the inner region is spaced from the first side of the switching layer by a distance D1; a second side of the inner region is spaced from the second side of the switching layer by a distance D2; D1 and D2 may be the same or different; and D1 and D2 each range from greater than 0 to about 50 nanometers Example 55

This example includes any or all of the features of example 40, wherein when the resistive memory cell is in the ON condition, the switching layer includes a single filament within the width, W1, of the inner region.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A method of forming a resistive memory cell, comprising:
providing a substrate comprising a dielectric material having a trench formed therein;
forming a first electrode;
forming a switching layer precursor having a total width W on said first electrode by depositing a layer of a sub-stoichiometric oxide within said trench, said sub-stoichiometric oxide including a plurality of oxygen vacancies;
forming a second electrode on said switching layer precursor;
processing said switching layer precursor to form an inner region and first and second outer regions adjacent to said inner region, wherein said processing comprises exposing a first side and a second side of said switching layer precursor to an atmosphere containing oxygen by forming one or more access holes in said dielectric material and heat treating the resulting structure in said atmosphere, so as to occupy with oxygen at least some of the plurality of oxygen vacancies that are proximate to said first and second sides, and wherein after said processing:
said inner region has a width W1 that is less than the total width W of said switching layer; and
said first and second outer regions each comprise a substantially stoichiometric oxide; and
executing a forming process to form a switching layer comprising at least one filament, wherein the at least one filament is present only within said width W1 of said inner region.

2. The method of claim 1, wherein:
forming said switching layer precursor comprises depositing a layer of said sub-stoichiometric oxide on said first electrode.

3. The method of claim 1, further comprising forming a protective layer on said first and second sides of said switching layer precursor, wherein said protective layer comprises an oxygen impermeable material.

4. The method of claim 1, wherein said processing further comprises heat treating said switching layer precursor in said atmosphere containing oxygen.

5. The method of claim 2, wherein:
depositing said layer of sub-stoichiometric oxide within said trench includes depositing said layer such that said first and second sides of said switching layer precursor respectively contact opposing sidewalls of said trench.

6. The method of claim 1, further comprising forming an oxygen exchange layer (OEL) on said switching layer precursor such that at least a portion of said OEL is between said second electrode and said switching layer precursor, wherein after said processing, said inner region is disposed below said OEL.

7. The method of claim 6, wherein:
forming said switching layer precursor comprises depositing a layer of a substantially stoichiometric oxide on said first electrode; and
said processing comprises heat treating said OEL and said switching layer precursor so as to form said inner region substantially beneath said OEL.

8. The method of claim 1, wherein:
said forming process causes said oxygen vacancies to form a single filament within said inner region.

9. A resistive memory cell, comprising:
a first electrode;
a switching layer having a total width W formed on the first electrode, wherein the switching layer includes a first side, a second side, an inner region comprising a sub-stoichiometric oxide, and first and second outer regions that are each adjacent to the inner region and that comprise a substantially stoichiometric oxide; and
a second electrode formed on the switching layer;
wherein said inner region has a width W1 that is less than the total width W of said switching layer, a first side that is spaced from said first side of said switching layer by a distance D1 that ranges from greater than 0 to about 50 nanometers, and a second side that is spaced from said second side of said switching layer by a distance D2 that ranges from greater than 0 to about 50 nanometers.

10. The resistive memory cell of claim 9, wherein said sub-stoichiometric oxide comprises a plurality of oxygen vacancies.

11. The resistive memory cell of claim 10, wherein said resistive memory cell is reconfigurable between an ON and OFF condition in response to an applied voltage; and
when said resistive memory cell is in the ON condition, at least a portion of said plurality of oxygen vacancies form at least one filament only within said width, W1, of said inner region.

12. The resistive memory cell of claim 11, wherein said resistive memory cell is in the OFF condition, said at least one filament is broken.

13. The resistive memory cell of claim 11, wherein when said resistive memory cell is in the ON condition, said switching layer comprises a single filament within said width, W1, of said inner region.

14. The resistive memory cell of claim 9, further comprising a protective layer on said first and second sides of said switching layer.

15. The resistive memory cell of claim 9, further comprising a substrate comprising a dielectric material having a trench formed therein, said trench comprising opposing sidewalls, wherein said first electrode, second electrode, and switching layer are formed within said trench.

16. The resistive memory cell of claim 9, further comprising an oxygen exchange layer (OEL) formed on said switching layer such that at least a portion of said OEL is between said second electrode and said switching layer, wherein said inner region is disposed below said OEL.

17. A computing device comprising a processor and a memory, said memory comprising at least on resistive memory cell, said resistive memory cell comprising:
   a first electrode;
   a switching layer having a total width W formed on the first electrode, wherein the switching layer includes a first side, a second side, an inner region comprising a sub-stoichiometric oxide, and first and second outer regions that are each adjacent to the inner region and that comprise a substantially stoichiometric oxide; and
   a second electrode formed on the switching layer;
   wherein said inner region has a width W1 that is less than the total width W of said switching layer, a first side that is spaced from said first side of said switching layer by a distance D1 that ranges from greater than 0 to about 50 nanometers, and a second side that is spaced from said second side of said switching layer by a distance D2 that ranges from greater than 0 to about 50 nanometers.

18. The computing device of claim 17, wherein said sub-stoichiometric oxide comprises a plurality of oxygen vacancies.

19. The computing device of claim 18, wherein:
   said resistive memory cell is reconfigurable between an ON and OFF condition in response to an applied voltage; and
   when said resistive memory cell is in the ON condition, at least a portion of said plurality of oxygen vacancies form at least one filament only within said width, W1, of said inner region.

20. The computing device of claim 19, wherein when said resistive memory cell is in the ON condition, said switching layer comprises a single filament within said width W1 of said inner region.

21. The computing device of claim 17, wherein when said resistive memory cell is in the OFF condition, said at least one filament is broken.

22. The computing device of claim 17, further comprising a protective layer on said first and second sides of said switching layer, wherein said protective layer comprises an oxygen impermeable material.

23. The computing device of claim 17, wherein said resistive memory cell further comprises a substrate comprising a dielectric material having a trench formed therein, said trench comprising opposing sidewalls, wherein said first electrode, second electrode, and switching layer are formed within said trench.

24. The computing device of claim 17, wherein said resistive memory cell further comprises an oxygen exchange layer (OEL) formed on said switching layer such that at least a portion of said OEL is between said second electrode and said switching layer, wherein said inner region is disposed below said OEL.

* * * * *